(12) United States Patent
Lee et al.

(10) Patent No.: US 10,930,693 B2
(45) Date of Patent: Feb. 23, 2021

(54) SEMICONDUCTOR DEVICES INCLUDING SUPPORT REGION AND METHODS OF FORMING THE SAME

(71) Applicant: Samsung Electronics Co., Ltd., Suwon-si (KR)

(72) Inventors: Jae Kyu Lee, Hwasung-si (KR); Ji Yoon Kim, Hwasung-si (KR); Seung Sik Kim, Hwasung-si (KR); Min Woong Seo, Hwasung-si (KR); Ji Youn Song, Hwasung-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 7 days.

(21) Appl. No.: 16/540,713

(22) Filed: Aug. 14, 2019

(65) Prior Publication Data
US 2020/0279876 A1 Sep. 3, 2020

(30) Foreign Application Priority Data

Feb. 28, 2019 (KR) .................. 10-2019-0023863

(51) Int. Cl.
*H01L 27/146* (2006.01)
*H04N 5/369* (2011.01)

(52) U.S. Cl.
CPC ...... *H01L 27/1463* (2013.01); *H01L 27/1464* (2013.01); *H01L 27/14621* (2013.01); *H01L 27/14623* (2013.01); *H01L 27/14627* (2013.01); *H01L 27/14636* (2013.01); *H01L 27/14645* (2013.01); *H01L 27/14685* (2013.01); *H01L 27/14689* (2013.01); *H04N 5/369* (2013.01)

(58) Field of Classification Search
CPC ......... H01L 27/14603; H01L 27/14612; H01L 27/14621; H01L 27/14623; H01L 27/14627; H01L 27/1463; H01L 27/14636; H01L 27/1464; H01L 27/14645; H01L 27/14685; H01L 27/14689; H04N 5/369
USPC ...................................... 257/228
See application file for complete search history.

(56) References Cited

U.S. PATENT DOCUMENTS

| | | | |
|---|---|---|---|
| 8,796,057 B2 | 8/2014 | Anderson et al. | |
| 9,515,120 B2 | 12/2016 | Um et al. | |
| 9,640,577 B2 | 5/2017 | Oh et al. | |
| 10,134,791 B1 | 11/2018 | Chen et al. | |
| 10,163,959 B2 | 12/2018 | Yamashita et al. | |

(Continued)

FOREIGN PATENT DOCUMENTS

| | | |
|---|---|---|
| JP | 2018-160485 A | 10/2018 |
| JP | 2018-198272 A | 12/2018 |

*Primary Examiner* — Long K Tran
(74) *Attorney, Agent, or Firm* — Harness, Dickey & Pierce, P.L.C.

(57) ABSTRACT

A semiconductor device includes a substrate having a first surface and a second surface opposite to the first surface. A device isolation layer which defines a first region, a second region, and a support region in the substrate. The second region has a smaller width than the first region, and the support region is between the first region and the second region. A photoelectric conversion element is in the first region. The support region is continuous with the first region and the second region. The device isolation layer has an integral insulation structure which extends through the substrate from the first surface of the substrate to the second surface of the substrate.

20 Claims, 17 Drawing Sheets

(56) References Cited

U.S. PATENT DOCUMENTS

| | | |
|---|---|---|
| 2013/0164877 A1 | 6/2013 | Anderson et al. |
| 2014/0327051 A1 | 11/2014 | Ahn et al. |
| 2016/0204150 A1 | 7/2016 | Oh et al. |
| 2016/0225815 A1 | 8/2016 | Um et al. |
| 2017/0141145 A1 | 5/2017 | Yamashita et al. |
| 2018/0270439 A1 | 9/2018 | Guyader et al. |
| 2018/0278863 A1 | 9/2018 | Roy |
| 2019/0057989 A1* | 2/2019 | Ishiwata ........... H01L 27/14634 |

* cited by examiner

SEMICONDUCTOR DEVICES INCLUDING SUPPORT REGION AND METHODS OF FORMING THE SAME

CROSS-REFERENCE TO RELATED APPLICATION

This U.S. non-provisional patent application claims priority under 35 U.S.C. § 119 to and the benefit of Korean Patent Application No. 10-2019-0023863, filed on Feb. 28, 2019, the disclosure of which is incorporated herein by reference in its entirety.

BACKGROUND

1. Field

Devices and methods consistent with example embodiments relate to an image sensor having a support region between a light-receiving region and a light-blocking region, semiconductor devices including one or more image sensors, and methods of forming the semiconductor devices.

2. Description of Related Art

Rear light-receiving image sensors are in use. A pixel region of a rear light-receiving image sensor may include a device isolation layer configured to define a plurality of regions. With an increase in integration density, each of the plurality of regions may have a high aspect ratio. The process of forming the device isolation layer is vulnerable to defects such as leaning.

SUMMARY

The example embodiments of the inventive concepts are directed to providing image sensors having high mass production efficiency and excellent electrical properties, semiconductor devices including the image sensor, and methods of forming the semiconductor devices.

According to some example embodiments of the inventive concepts, there is provided a semiconductor device including a substrate having a first surface and a second surface opposite to the first surface. A device isolation layer which defines a first region, a second region, and a support region in the substrate. The second region has a smaller width than the first region, and the support region is between the first region and the second region. A photoelectric conversion element is in the first region. The support region is continuous with the first region and the second region. The device isolation layer has an integral insulation structure which extends through the substrate from the first surface of the substrate to the second surface of the substrate.

According to some example embodiments of the inventive concepts, there is provided a semiconductor device including a substrate having a first surface and a second surface opposite to the first surface. A device isolation layer which extends through the substrate from the first surface of the substrate to the second surface of the substrate and defines a plurality of light-receiving regions, a plurality of light-blocking regions, and a plurality of support regions in the substrate. Each of the plurality of support regions are respectively between each one of the plurality of light-receiving regions and one of the plurality of light-blocking regions. A plurality of photoelectric conversion elements are in the plurality of light-receiving regions. Each of the plurality of light-blocking regions has a smaller width than each of the plurality of light-receiving regions. The device isolation layer has an integral insulation structure. The plurality of light-blocking regions include a first light-blocking region and a second light-blocking region, which are isolated from direct contact with each other. The plurality of light-receiving regions include a first light-receiving region and a second light-receiving region, which are isolated from direct contact with each other between the first light-blocking region and the second light-blocking region. A corresponding one of the plurality of support regions is continuous with the first light-receiving region and the second light-blocking region. Another corresponding one of the plurality of support regions is continuous with the second light-receiving region and the first light-blocking region.

According to some example embodiments of the inventive concepts, there is provided a semiconductor device including a substrate having a first surface and a second surface opposite to the first surface. A device isolation layer defines a light-receiving region, a light-blocking region, and a support region in the substrate. The light-blocking region has a smaller width than the light-receiving region, and the support region is between the light-receiving region and the light-blocking region. A photoelectric conversion element is in the light-receiving region and adjacent to the second surface. A floating diffusion region is disposed in the light-receiving region and adjacent to the first surface. A transfer transistor, a first source-follower transistor, a pre-charge transistor, a second source-follower transistor, a selection transistor, and a first ground region are on the light-receiving region and adjacent to the first surface. A first capacitor and a second capacitor are on the first surface of the substrate. A reset transistor, a sample transistor, a calibration transistor, and a second ground region are on the light-blocking region and adjacent to the first surface. The support region is adjacent to the first ground region. The support region is continuous with the light-receiving region and the light-blocking region. The device isolation layer has an internal insulation structure which extends through the substrate from the first surface of the substrate to the second surface of the substrate.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
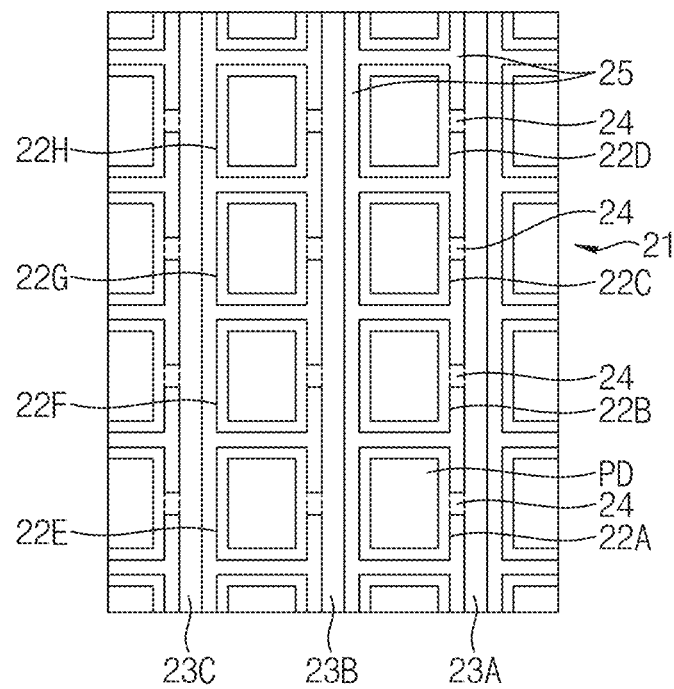
FIG. 1 is a layout illustrating a semiconductor device according to some example embodiments of the inventive concepts.
Figure 2:
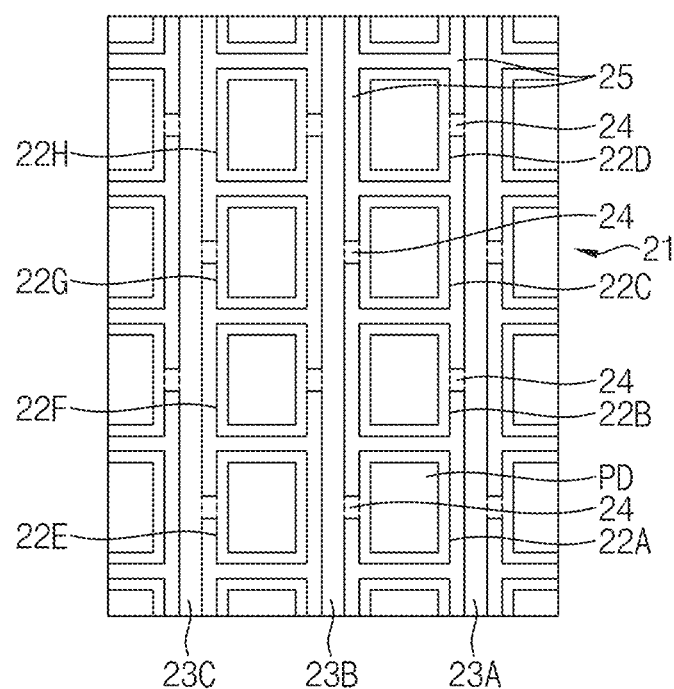
FIG. 2 is a layout illustrating a semiconductor device according to some example embodiments of the inventive concepts.
Figure 3:
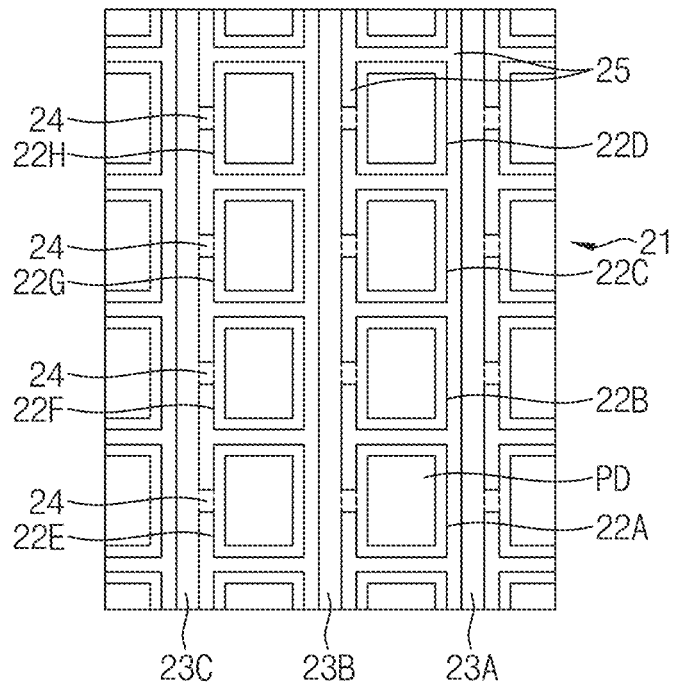
FIG. 3 is a layout illustrating a semiconductor device according to some example embodiments of the inventive concepts.

FIGS. 1 to 3 are layouts illustrating a semiconductor device according to some example embodiments of the inventive concepts. The semiconductor device according to some example embodiments of the inventive concepts may include an image sensor, such as a rear light-receiving image sensor. In an example embodiment, the semiconductor device according to some example embodiments of the inventive concepts may include a global shutter image sensor.

Referring to FIG. 1, the semiconductor device according to some example embodiments of the inventive concepts may include a substrate 21 and a first device isolation layer 25. The substrate 21 may include a plurality of light-receiving regions 22A to 22H which are spaced apart ("isolated from direct contact with") from each other, a plurality of light-blocking regions 23A to 23C which are spaced apart from each other, and a plurality of support regions 24 which are spaced apart from each other. A plurality of photoelectric conversion elements PD may be disposed in the plurality of light-receiving regions 22A to 22H. Each of the plurality of photoelectric conversion elements PD may include a photodiode. Each of the plurality of light-blocking regions 23A to 23C may have a smaller width than each of the plurality of light-receiving regions 22A to 22H.

The plurality of light-receiving regions 22A to 22H, the plurality of light-blocking regions 23A to 23C, and the plurality of support regions 24 may be defined in the substrate 21 by the first device isolation layer 25. The plurality of support regions 24 may be disposed between the plurality of light-receiving regions 22A to 22H and the plurality of light-blocking regions 23A to 23C. For example, one of the plurality of support regions 24 may be between one of the plurality of light-receiving regions 22A to 22H and a corresponding (e.g., "separate, respective") one of the plurality of light-blocking regions 23A to 23C. At least a portion of the first device isolation layer 25 may be disposed between the plurality of light-receiving regions 22A to 22H and the plurality of light-blocking regions 23A to 23C. The first device isolation layer 25 may be in direct contact with side surfaces of the plurality of support regions 24. As shown in FIG. 1, in some example embodiments the first device isolation layer may surround one of the plurality of light-receiving regions 22A to 22H in conjunction with one of the plurality of support regions 24, such that it will be understood that, as shown in FIG. 1, the plurality of light-receiving regions 22A to 22H are separated from the light-blocking regions 23A to 23C by the first device isolation layer 25 and plurality of support regions 24.

It will be understood that an element that is "on" another element may be above or below the other element. It will be further understood that an element that is "on" another element may be "directly" on the other element, such that the elements are in direct contact with each other, or may be "indirectly" on the other element, such that the elements are isolated from direct contact with each other by one or more interposing spaces and/or structures.

In an example embodiment, the first to fourth light-receiving regions 22A to 22D, which are spaced apart ("isolated from direct contact with") from each other, may be disposed between a first light-blocking region 23A and a second light-blocking region 23B. Fifth to eighth light-receiving regions 22E to 22H, which are spaced apart from each other, may be disposed between the second light-blocking region 23B and a third light-blocking region 23C. The plurality of support regions 24 may be disposed between the first light-blocking region 23A and the first to fourth light-receiving regions 22A to 22D. The plurality of support regions 24 may be disposed between the second light-blocking region 23B and the fifth to eighth light-receiving regions 22E to 22H. Each of the plurality of support regions 24 may be continuous with a corresponding one of the plurality of light-receiving regions 22A to 22H and a corresponding one of the plurality of light-blocking regions 23A to 23C, such that the plurality of support regions 24 is along the length of one of the plurality of light-receiving regions 22A to 22H and a corresponding one of the plurality of light-blocking regions 23A to 23C. In an example embodiment, each of the plurality of light-receiving regions 22A to 22H may correspond to a first region, and each of the plurality of light-blocking regions 23A to 23C may correspond to a second region.

Referring to FIG. 2, the semiconductor device according to some example embodiments of the inventive concepts may include a substrate 21 and a first device isolation layer 25. The substrate 21 may include a plurality of light-receiving regions 22A to 22H which are spaced apart ("isolated from direct contact with") from each other, a plurality of light-blocking regions 23A to 23C which are spaced apart ("isolated from direct contact with") from each other, and a plurality of support regions 24 which are spaced apart from each other. A plurality of photoelectric conversion elements PD may be disposed in the plurality of light-receiving regions 22A to 22H. The plurality of support regions 24 may be arranged to be zigzag.

In an example embodiment, the plurality of light-blocking regions 23A to 23C may include first and second light-blocking regions 23A and 23B which are spaced apart from each other. The plurality of light-receiving regions 22A to 22H may include first and second light-receiving regions 22A and 22B which are spaced apart from each other between the first and second light-blocking regions 23A and 23B. A corresponding one of the plurality of support regions 24 may be continuous with the first light-receiving region 22A and the second light-blocking region 23B, such that the one of the plurality of support regions 24 is along the first length light-receiving region 22A and the second light-blocking region 23B. Another corresponding one of the plurality of support regions 24 may be continuous with the second light-receiving region 22B and the first light-blocking region 23A, such that one of the plurality of support regions 24 is along the length of second light-receiving region 22B and the first light-blocking region 23A. It will be understood that, as shown in FIG. 2, the plurality of light-receiving regions 22A to 22H are separated from the light-blocking regions 23A to 23C by the first device isolation layer 25 and plurality of support regions 24.

Referring to FIG. 3, the plurality of support regions 24 may be disposed between the second light-blocking region 23B and the first to fourth light-receiving regions 22A to 22D. The plurality of support regions 24 may be disposed between a third light-blocking region 23C and fifth to eighth light-receiving regions 22E to 22H. It will be understood that, as shown in FIG. 3, the plurality of light-receiving regions 22A to 22H are separated from the light-blocking regions 23A to 23C by the first device isolation layer 25 and plurality of support regions 24.

Figure 4:
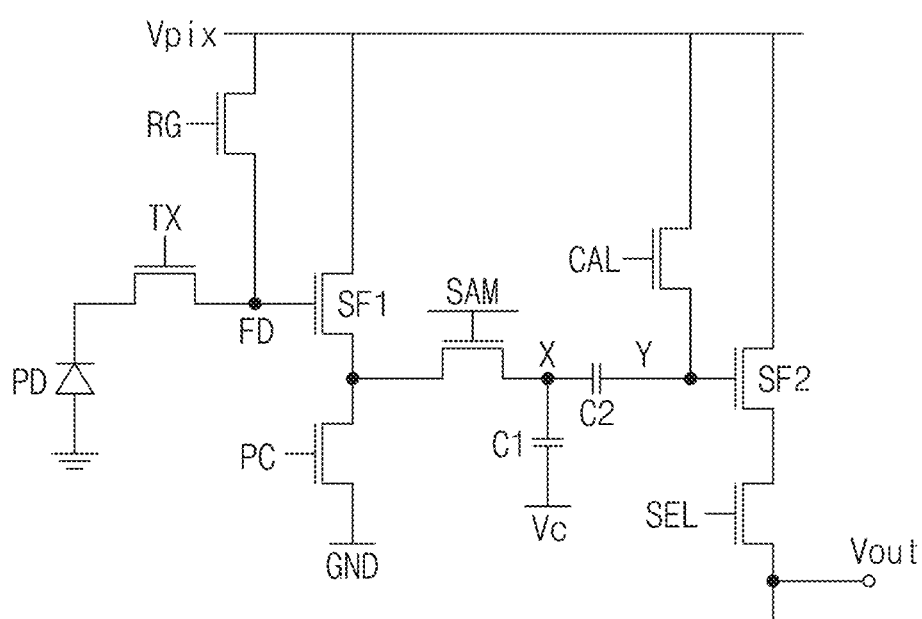
FIG. 4 is a circuit diagram illustrating a semiconductor device according to some example embodiments of the inventive concepts.
Figure 5:
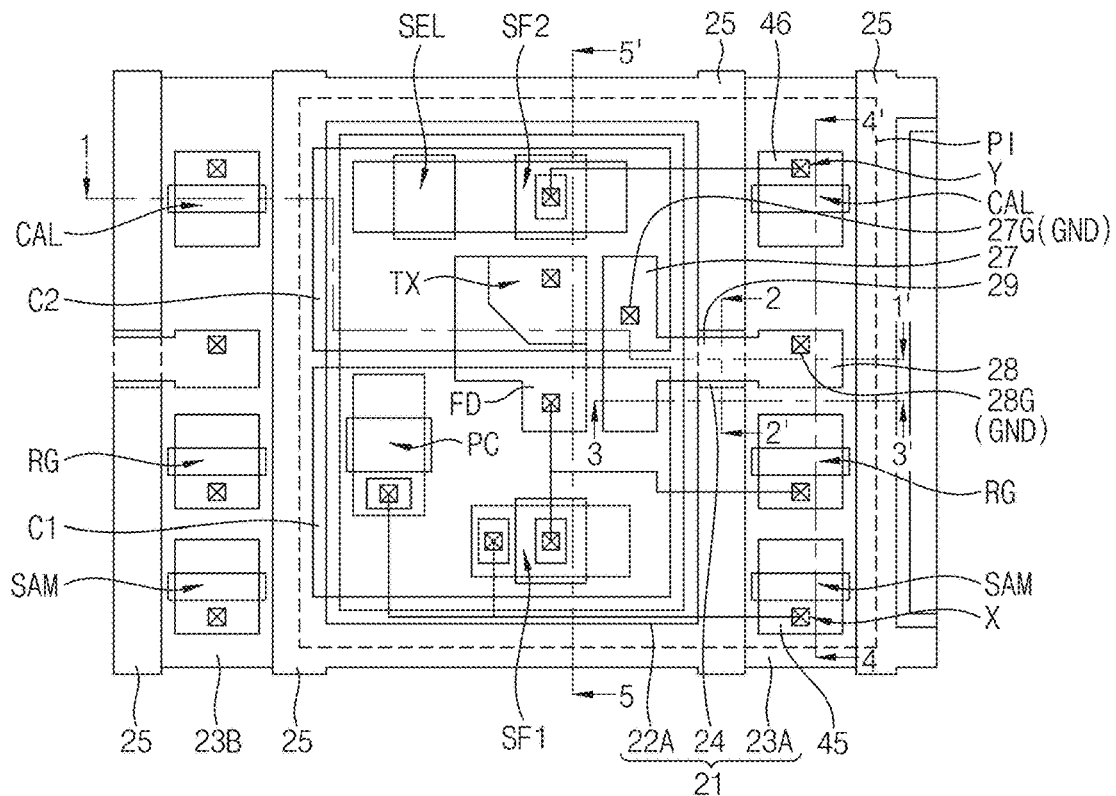
FIG. 5 is a layout illustrating a semiconductor device according to some example embodiments of the inventive concepts.
Figure 6:
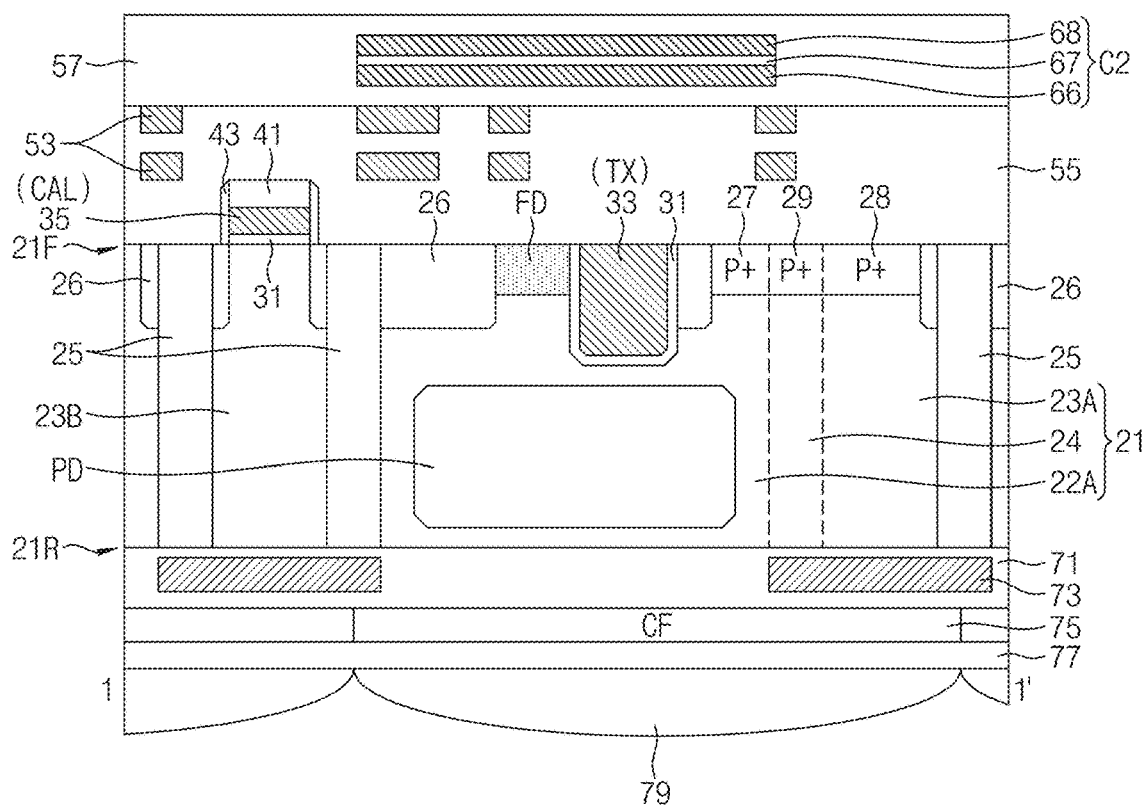
FIG. 6 is a cross-sectional view taken along line 1-1' of FIG. 5 according to some example embodiments of the inventive concepts.
Figure 7:
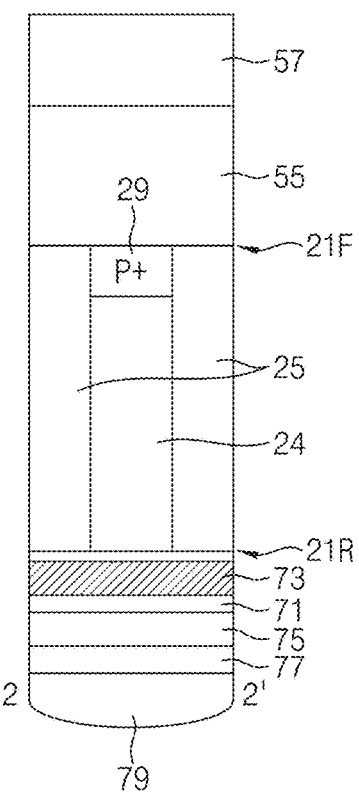
FIG. 7 is a cross-sectional view taken along line 2-2' of FIG. 5 according to some example embodiments of the inventive concepts.
Figure 8:
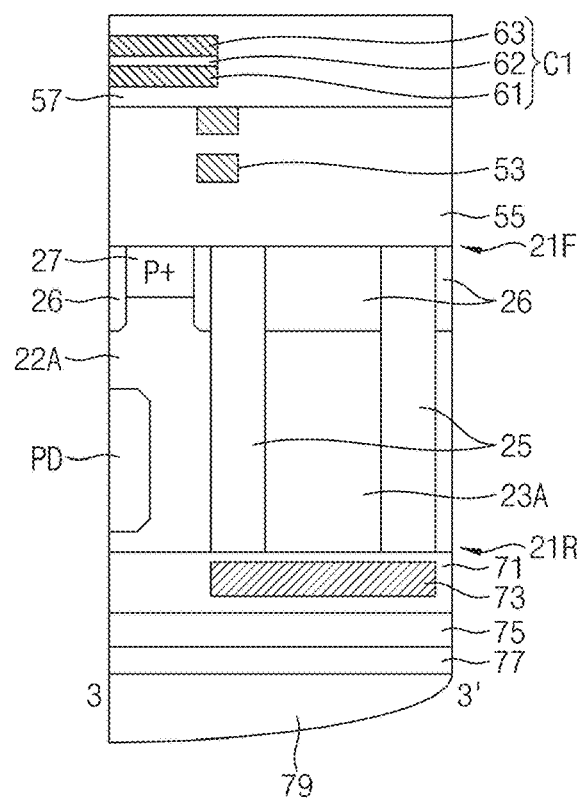
FIG. 8 is a cross-sectional view taken along line 3-3' of FIG. 5 according to some example embodiments of the inventive concepts.
Figure 9:
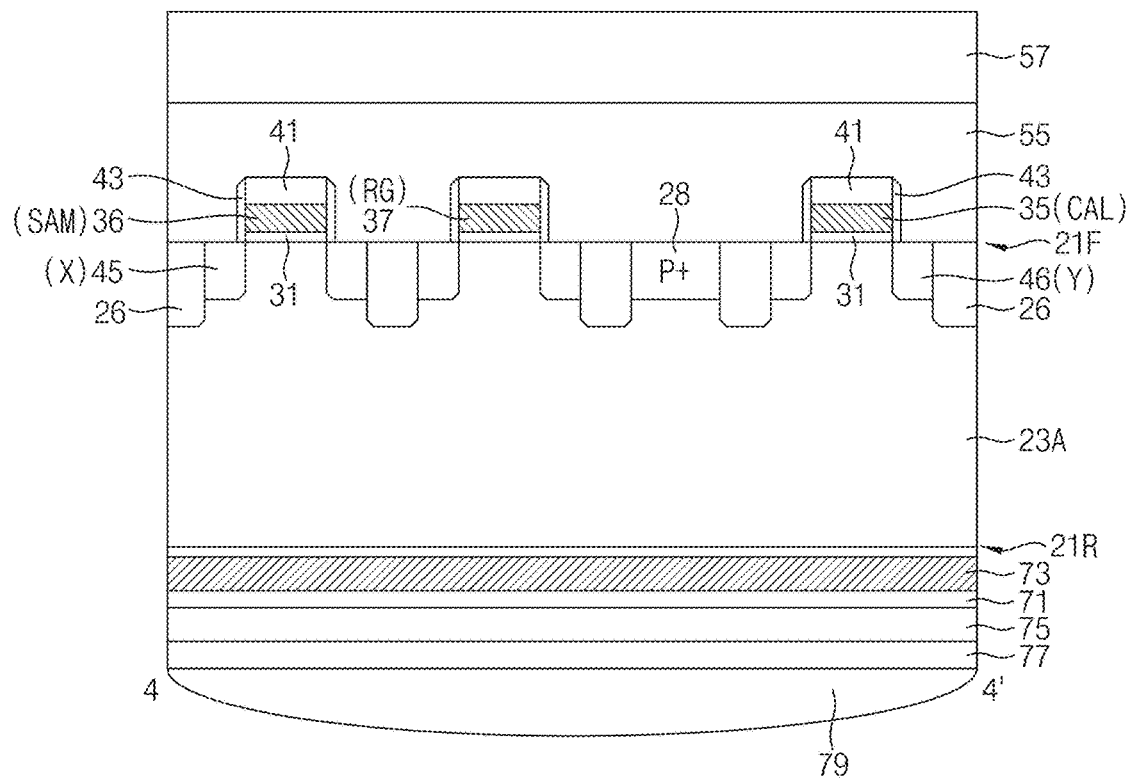
FIG. 9 is a cross-sectional view taken along line 4-4' of FIG. 5 according to some example embodiments of the inventive concepts.
Figure 10:
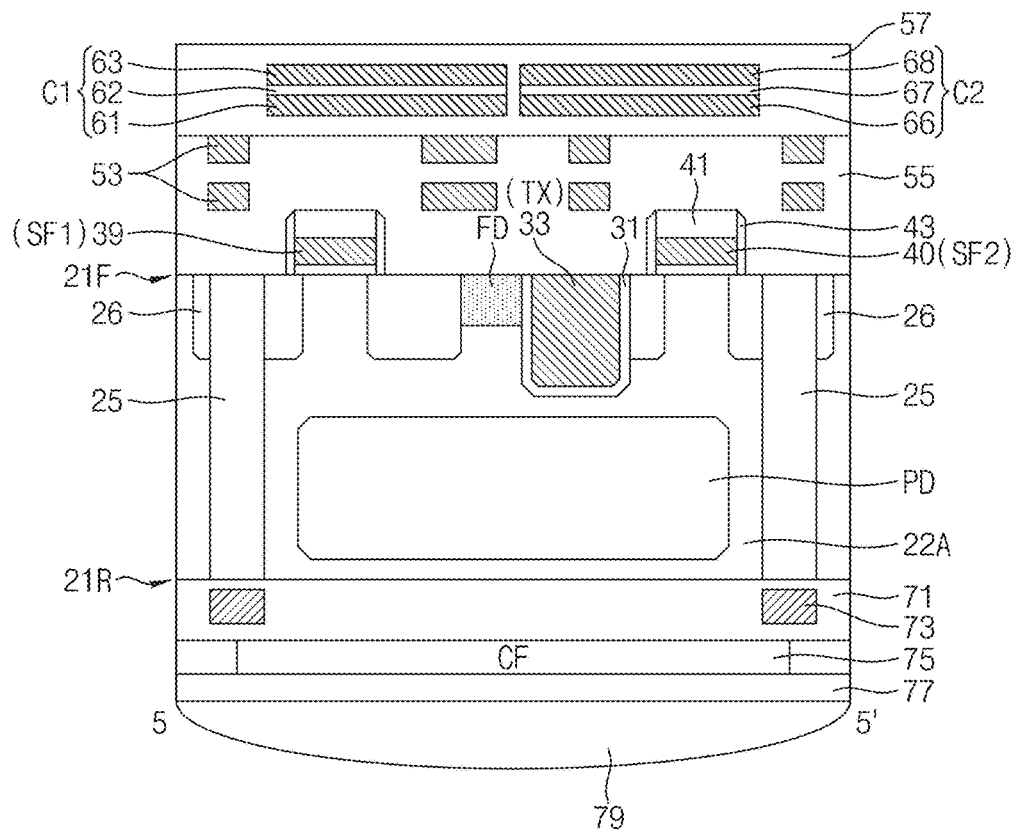
FIG. 10 is a cross-sectional view taken along line 5-5' of FIG. 5 according to some example embodiments of the inventive concepts.

FIG. 4 is a circuit diagram illustrating a semiconductor device according to some example embodiments of the inventive concepts. FIG. 5 is a layout illustrating a semiconductor device according to some example embodiments of the inventive concepts. FIG. 6 is a cross-sectional view taken along line 1-1' of FIG. 5 according to some example embodiments of the inventive concepts. FIG. 7 is a cross-sectional view taken along line 2-2' of FIG. 5 according to some example embodiments of the inventive concepts. FIG. 8 is a cross-sectional view taken along line 3-3' of FIG. 5 according to some example embodiments of the inventive concepts. FIG. 9 is a cross-sectional view taken along line 4-4' of FIG. 5 according to some example embodiments of the inventive concepts. FIG. 10 is a cross-sectional view taken along line 5-5' of FIG. 5 according to some example embodiments of the inventive concepts.

Referring to FIG. 4, the semiconductor device according to some example embodiments of the inventive concepts may include a pixel region of a rear light-receiving image sensor. The semiconductor device may include a photoelectric conversion element PD, a transfer transistor TX, a floating diffusion region FD, a reset transistor RG, a first source-follower transistor SF1, a pre-charge transistor PC, a sample transistor SAM, a first capacitor C1, a second capacitor C2, a calibration transistor CAL, a second source-follower transistor SF2, a selection transistor SEL, a first node X, and a second node Y.

Referring to FIG. 5, the semiconductor device according some example embodiments of the inventive concepts may include a pixel region P1 of a rear light-receiving image sensor. The semiconductor device may include a substrate 21, a first device isolation layer 25, a first ground region 27, a second ground region 28, a third ground region 29, a first ground interconnection 27G, a second ground interconnection 28G, a photoelectric conversion element PD, a transfer transistor TX, a floating diffusion region FD, a reset transistor RG, a first source-follower transistor SF1, a pre-charge transistor PC, a sample transistor SAM, a first capacitor C1, a second capacitor C2, a calibration transistor CAL, a second source-follower transistor SF2, a selection transistor SEL, a first node X, and a second node Y.

The substrate 21 may include a first light-receiving region 22A, a first light-blocking region 23A, a second light-blocking region 23B, and a plurality of support regions 24. The first node X may include a first drain region 45 of the sample transistor SAM. The second node Y may include a second drain region 46 of the calibration transistor CAL. The pixel region P1 may include the first light-receiving region 22A, the first light-blocking region 23A, and a corresponding one of the plurality of support regions 24.

The photoelectric conversion element PD, the transfer transistor TX, the floating diffusion region FD, the first source-follower transistor SF1, the pre-charge transistor PC, the second source-follower transistor SF2, the selection transistor SEL, and the first ground region 27 may be disposed in the first light-receiving region 22A. The reset transistor RG, the sample transistor SAM, the calibration transistor CAL, and the second ground region 28 may be disposed in the first light-blocking region 23A. The third ground region 29 may be disposed in the plurality of support regions 24.

Referring to FIG. 6, a semiconductor device according to some example embodiments of the inventive concepts may include a substrate 21, a first device isolation layer 25, a second device isolation layer 26, a first ground region 27, a second ground region 28, a third ground region 29, a photoelectric conversion element PD, a gate dielectric layer 31, a first gate electrode 33 of a transfer transistor TX, a floating diffusion region FD, a second gate electrode 35 of a calibration transistor CAL, a gate capping layer 41, a gate spacer 43, a plurality of interconnections 53, a first insulating layer 55, a second insulating layer 57, a second capacitor C2, a third insulating layer 71, a light-blocking pattern 73, a color filter 75, a fourth insulating layer 77, and a microlens 79.

The substrate 21 may include a front surface 21F and a rear surface 21R opposite to the front surface 21F. The front surface 21F may correspond to a first surface, and the rear surface 21R may correspond to a second surface. The substrate 21 may include a first light-receiving region 22A, a first light-blocking region 23A, a second light-blocking region 23B, and a support region 24.

Referring to FIG. 7, a semiconductor device according to some example embodiments of the inventive concepts may include a support region 24, a first device isolation layer 25, a third ground region 29, a first insulating layer 55, a second insulating layer 57, a third insulating layer 71, a light-blocking pattern 73, a color filter 75, a fourth insulating layer 77, and a microlens 79.

Referring to FIG. 8, a semiconductor device according some example embodiments of the inventive concepts may include a first light-receiving region 22A, a first light-blocking region 23A, a first device isolation layer 25, a second device isolation layer 26, a first ground region 27, a photoelectric conversion element PD, a first insulating layer 55, a second insulating layer 57, a first capacitor C1, a third insulating layer 71, a light-blocking pattern 73, a color filter 75, a fourth insulating layer 77, and a microlens 79.

Referring to FIG. 9, a semiconductor device according to some example embodiments of the inventive concepts may include a first light-blocking region 23A, a second device isolation layer 26, a second ground region 28, a gate dielectric layer 31, a third gate electrode 36 of a sample transistor SAM, a first drain region 45 of the sample transistor SAM, a fourth gate electrode 37 of a reset transistor RG, a second gate electrode 35 of a calibration transistor CAL, a second drain region 46 of the calibration transistor CAL, a gate capping layer 41, gate spacers 43, a first insulating layer 55, a second insulating layer 57, a third insulating layer 71, a light-blocking pattern 73, a color filter 75, a fourth insulating layer 77, and a microlens 79.

The first drain region 45 of the sample transistor SAM may at least partially comprise a first node X. The second drain region 46 of the calibration transistor CAL may at least partially comprise a second node Y.

Referring to FIG. 10, a semiconductor device according to some example embodiments of the inventive concepts may include a first light-receiving region 22A, a first device isolation layer 25, a second device isolation layer 26, a photoelectric conversion element PD, a gate dielectric layer 31, a first gate electrode 33 of a transfer transistor TX, a floating diffusion region FD, a fifth gate electrode 39 of a first source-follower transistor SF1, a sixth gate electrode 40 of a second source-follower transistor SF2, gate capping layers 41, gate spacers 43, a plurality of interconnections 53, a first insulating layer 55, a second insulating layer 57, a first capacitor C1, a second capacitor C2, a third insulating layer 71, a light-blocking pattern 73, a color filter 75, a fourth insulating layer 77, and a microlens 79.

The first capacitor C1 and the second capacitor C2 may be disposed in the second insulating layer 57. The first capacitor C1 may include a first electrode 61, a second electrode 63 opposite to the first electrode 61, and a first capacitor dielectric layer 62 interposed between the first electrode 61 and the second electrode 63. The second capacitor C2 may include a third electrode 66, a fourth electrode 68 opposite to the third electrode 66, and a second capacitor dielectric layer 67 interposed between the third electrode 66 and the fourth electrode 68. In an example embodiment, each of the first capacitor C1 and the second capacitor C2 may include any kind of three-dimensional (3D) capacitor such as a cylinder type, a pillar type, a box type, or a combination thereof. Each of the first capacitor C1 and the second capacitor C2 may include a capacitor array including a plurality of capacitors which are connected in parallel and/or in series.

Referring again to FIGS. 4 to 10, the first light-receiving region 22A, the first light-blocking region 23A, and the support region 24 may be defined in the substrate 21 by the first device isolation layer 25. The first device isolation layer 25 may include an integral insulation structure which is formed to pass completely through ("extend") the substrate 21 from the front surface 21F of the substrate 21 to the rear surface 21R thereof. The first light-blocking region 23A may have a smaller width than the first light-receiving region 22A. The support region 24 may be disposed between the first light-receiving region 22A and the first light-blocking region 23A. The support region 24 may be continuous with the first light-receiving region 22A and the first light-blocking region 23A between the light-receiving region 22A and the first light-blocking region 23A, such that the support region 24 is along the length the light-receiving regions 22A and the first light-blocking regions 23A. At least one portion of the first device isolation layer 25 may be disposed between the first light-receiving region 22A and the first light-blocking region 23A. The first device isolation layer 25 may be in direct contact with a side surface of the support region 24.

The photoelectric conversion element PD may be formed adjacent to the rear surface 21R of the substrate 21. The second device isolation layer 26, the transfer transistor TX, the first gate electrode 33 of the transfer transistor TX, the floating diffusion region FD, the first source-follower transistor SF1, the pre-charge transistor PC, the second source-follower transistor SF2, the selection transistor SEL, the reset transistor RG, the sample transistor SAM, the first drain region 45 of the sample transistor SAM, the calibration transistor CAL, the second drain region 46 of the calibration transistor CAL, the first ground region 27, the second ground region 28, the third ground region 29, the first ground interconnection 27G, and the second ground interconnection 28G may be formed adjacent to the front surface 21F of the substrate 21.

In an example embodiment, the photoelectric conversion element PD and the floating diffusion region FD may be disposed in the first light-receiving region 22A. The transfer transistor TX, the first source-follower transistor SF1, the pre-charge transistor PC, the second source-follower transistor SF2, the selection transistor SEL, the first ground region 27, and the first ground interconnection 27G may be disposed on the first light-receiving region 22A. The reset transistor RG, the sample transistor SAM, the calibration transistor CAL, and the second ground region 28 may be disposed on the first light-blocking region 23A. The first capacitor C1 and the second capacitor C2 may be disposed on the front surface 21F of the substrate 21.

On the rear surface 21R of the substrate 21, surfaces of the first light-receiving region 22A, the first light-blocking region 23A, the support region 24, and the first device isolation layer 25 may be substantially coplanar. On the front surface 21F of the substrate 21, the surfaces of the first light-receiving region 22A, the first light-blocking region 23A, the support region 24, and the first device isolation layer 25 may be substantially coplanar. On the front surface 21F of the substrate 21, the surface of the support region 24 may be substantially coplanar with surfaces of the first light-receiving region 22A, the first light-blocking region 23A, and the first device isolation layer 25 which are adjacent to each other.

The first ground region 27 may be disposed in the first light-receiving region 22A. The first ground region 27 may be disposed adjacent to the support region 24. The second ground region 28 may be disposed in the first light-blocking region 23A. The second ground region 28 may be disposed adjacent to the support region 24. The third ground region 29 may be disposed in the support region 24. The third ground region 29 may be disposed between the first ground region 27 and the second ground region 28. The third ground region 29 may be continuous with the first ground region 27 and the second ground region 28, such that the third ground region 29 is along the length of the first ground region 27 and the second ground region 28. In an example embodiment, the first ground region 27 may correspond to a first impurity region, the second ground region 28 may correspond to a second impurity region, and the third ground region 29 may correspond to a third impurity region.

The substrate 21 may include P-type impurities having a first concentration. The first ground region 27 may include P-type impurities having a second concentration higher than the first concentration. The first ground region 27 may be connected to the first ground interconnection 27G. The second ground region 28 may include P-type impurities having a third concentration higher than the first concentration. The second ground region 28 may be connected to the second ground interconnection 28G. The third ground region 29 may include P-type impurities having a fourth concentration higher than the first concentration. The second concentration, the third concentration, and the fourth concentration may be substantially equal to each other.

The floating diffusion region FD may be disposed in the first light-receiving region 22A. The floating diffusion region FD may be disposed adjacent to the first gate electrode 33 of the transfer transistor TX. The floating diffusion region FD may include N-type impurities. The first ground region 27 may be disposed between the floating diffusion region FD and the support region 24. A thickness of the second device isolation layer 26 may be smaller than that of the first device isolation layer 25.

The reset transistor RG may be connected to the floating diffusion region FD. The pre-charge transistor PC may be connected to the first source-follower transistor SF1. The sample transistor SAM may be connected between the first source-follower transistor SF1 and the pre-charge transistor PC. The calibration transistor CAL may be connected to the fourth electrode 68 of the second capacitor C2. The selection transistor SEL may be connected to the second source-follower transistor SF2. A fifth gate electrode 39 of the first source-follower transistor SF1 may be connected to the floating diffusion region FD. The third electrode 66 of the second capacitor C2 may be connected to the sample transistor SAM and the first electrode 61 of the first capacitor C1. The sixth gate electrode 40 of the second source-follower transistor SF2 may be connected to the calibration transistor CAL and the fourth electrode 68 of the second capacitor C2.

One ends of the reset transistor RG, the first source-follower transistor SF1, the second source-follower transistor SF2, and the calibration transistor CAL may be connected to a first source power Vpix. One end of the pre-charge transistor PC may be connected to a ground GND. The second electrode 63 of the first capacitor C1 may be connected to a second source power Vc. One end of the selection transistor SEL may be connected to an output line Vout. The first drain region 45 of the sample transistor SAM may be connected to the first electrode 61 of the first capacitor C1 and the third electrode 66 of the second capacitor C2 to comprise the first node X. The second drain region 46 of the calibration transistor CAL may be connected to the fourth electrode 68 of the second capacitor C2 and the sixth gate electrode 40 of the second source-follower transistor SF2 to comprise the second node Y.

The first drain region 45 of the sample transistor SAM and the second drain region 46 of the calibration transistor CAL may be disposed in the first light-blocking region 23A. The first drain region 45 and the second drain region 46 may be formed adjacent to the front surface 21F of the substrate 21. Each of the first drain region 45 and the second drain region 46 may include N-type impurities. A distance between the second ground region 28 and the support region 24 may be smaller than a distance between the first drain region 45 and the support region 24. A distance between the second ground region 28 and the support region 24 may be smaller than a distance between the second drain region 46 and the support region 24.

The third insulating layer 71 may be formed on the rear surface 21R of the substrate 21. The light-blocking pattern 73 may be disposed in the third insulating layer 71. The light-blocking pattern 73 may include a light-blocking material such as a metal. The light-blocking pattern 73 may completely cover the rear surface 21R of the first light-blocking region 23A. The light-blocking pattern 73 may overlap the first device isolation layer 25. The color filter 75 may be disposed on the third insulating layer 71. The fourth insulating layer 77 may be formed on the color filter 75. The microlens 79 may be disposed on the fourth insulating layer 77. The light-blocking pattern 73 may be disposed between the rear surface 21R and the microlens 79.

Figure 11:
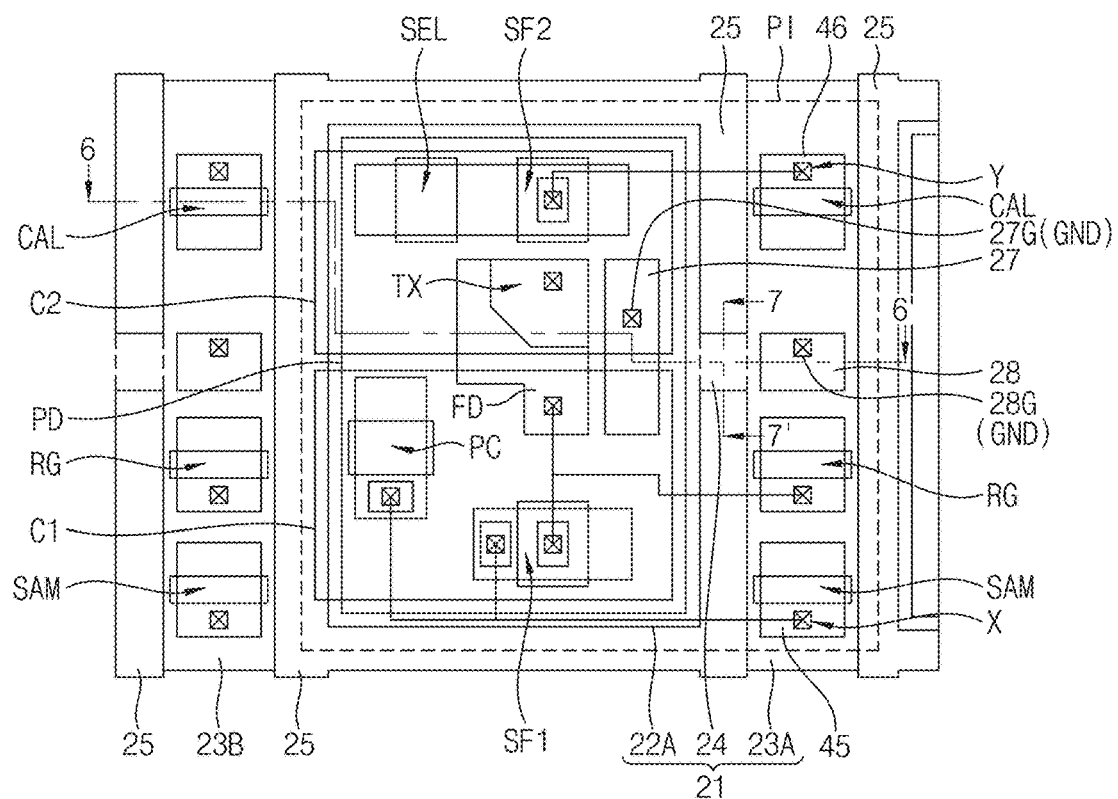
FIG. 11 is a layout illustrating a semiconductor device according to some example embodiments of the inventive concepts.
Figure 12:
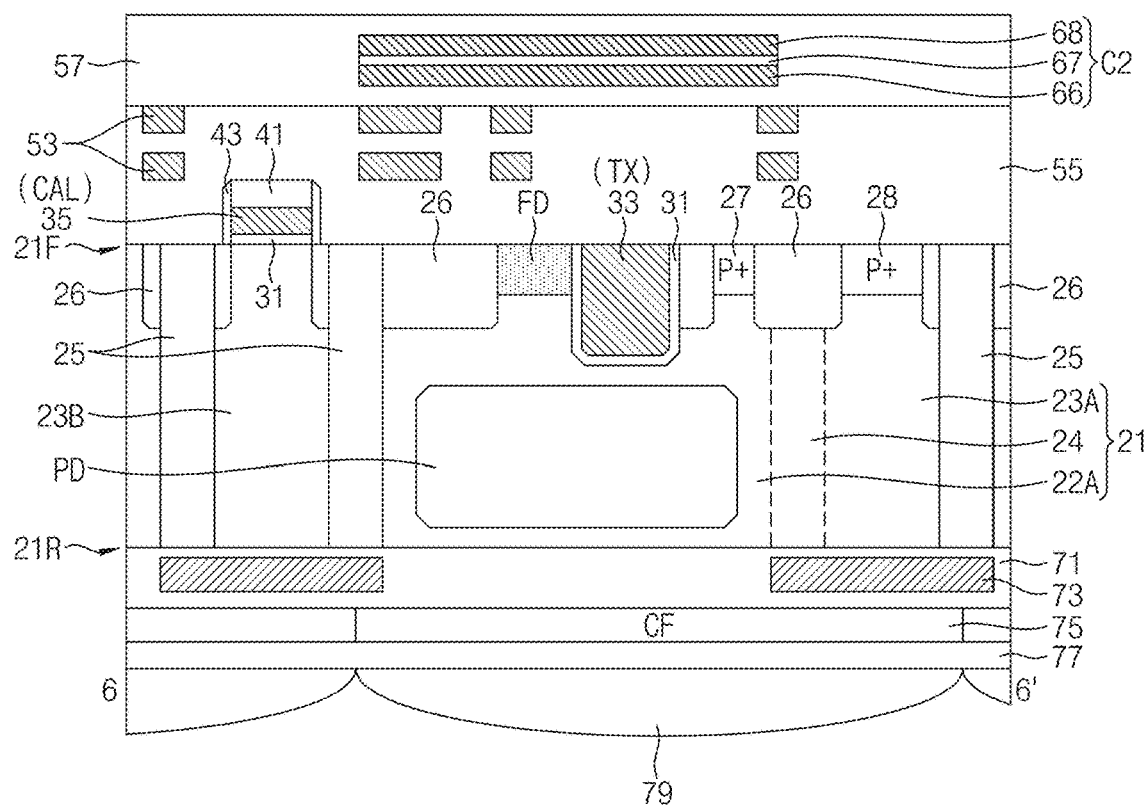
FIGS. 12 and 14 are cross-sectional views taken along line 6-6' of FIG. 11 according to some example embodiments of the inventive concepts.
Figure 13:
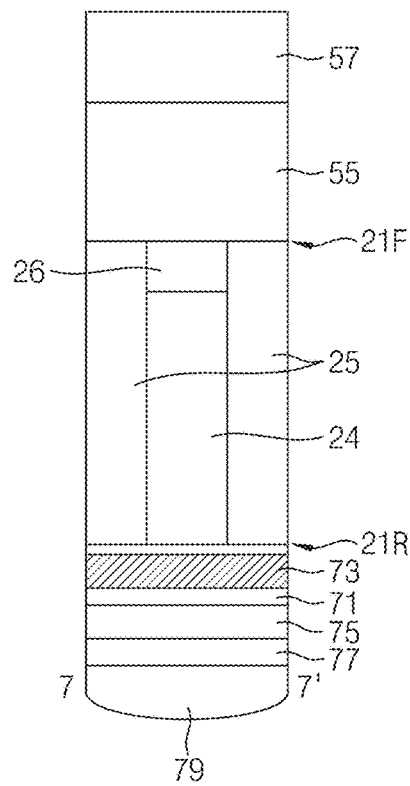
FIGS. 13 and 15 are cross-sectional views taken along line 7-7' of FIG. 11 according to some example embodiments of the inventive concepts.
Figure 14:
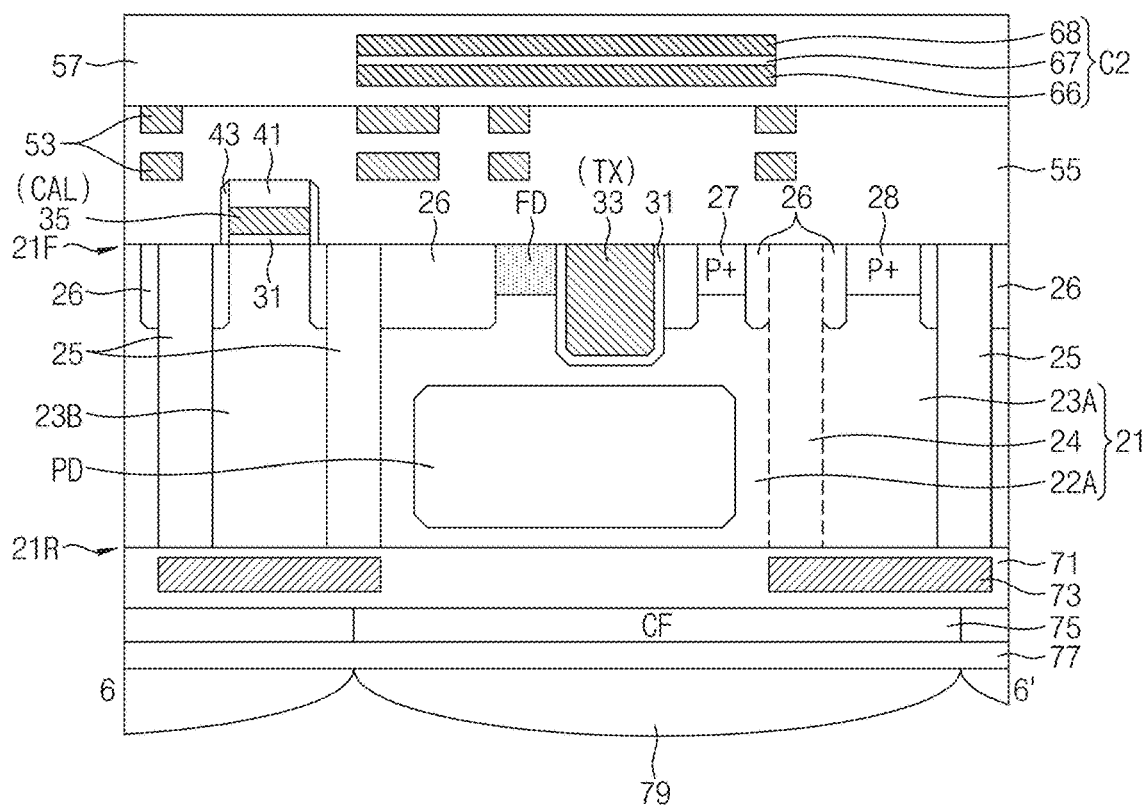
Figure 15:
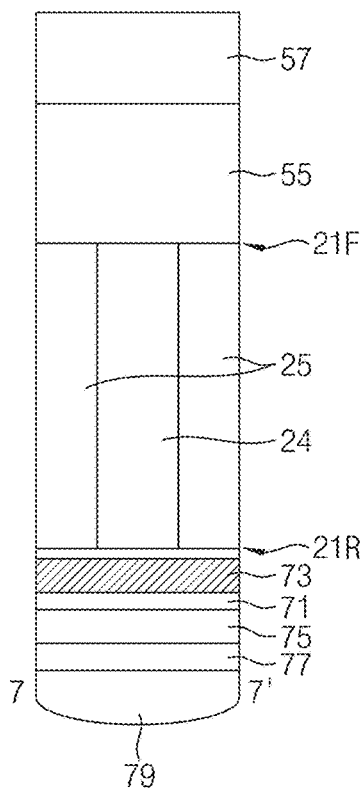

FIG. 11 is a layout illustrating a semiconductor device according to some example embodiments of the inventive concepts. FIGS. 12 and 14 are cross-sectional views taken along line 6-6' of FIG. 11 according to some example embodiments of the inventive concepts. FIGS. 13 and 15 are cross-sectional views taken along line 7-7' of FIG. 11 according to some example embodiments of the inventive concepts.

Referring to FIG. 11, the semiconductor device according to some example embodiments of the inventive concepts may include a pixel region P1 of a rear light-receiving image sensor. The semiconductor device may include a substrate 21, a first device isolation layer 25, a first ground region 27, a second ground region 28, a first ground interconnection 27G, a second ground interconnection 28G, a photoelectric conversion element PD, a transfer transistor TX, a floating diffusion region FD, a reset transistor RG, a first source-follower transistor SF1, a pre-charge transistor PC, a sample transistor SAM, a first capacitor C1, a second capacitor C2, a calibration transistor CAL, a second source-follower transistor SF2, a selection transistor SEL, a first node X, and a second node Y.

The substrate 21 may include a first light-receiving region 22A, a first light-blocking region 23A, a second light-blocking region 23B, and a plurality of support regions 24. The first node X may include a first drain region 45 of the sample transistor SAM. The second node Y may include a second drain region 46 of the calibration transistor CAL. The pixel region P1 may include the first light-receiving region 22A, the first light-blocking region 23A, and a corresponding one of the plurality of support regions 24.

Referring to FIG. 12, a semiconductor device according to some example embodiments of the inventive concepts may include a substrate 21, a first device isolation layer 25, a second device isolation layer 26, a first ground region 27, a second ground region 28, a photoelectric conversion element PD, a gate dielectric layer 31, a first gate electrode 33 of a transfer transistor TX, a floating diffusion region FD, a second gate electrode 35 of the calibration transistor CAL, a gate capping layer 41, gate spacers 43, a plurality of interconnections 53, a first insulating layer 55, a second insulating layer 57, a second capacitor C2, a third insulating layer 71, a light-blocking pattern 73, a color filter 75, a fourth insulating layer 77, and a microlens 79.

The substrate 21 may include a first light-receiving region 22A, a first light-blocking region 23A, a second light-blocking region 23B, and a support region 24. The second device isolation layer 26 may be formed on the support region 24. A top surface of the support region 24 may be recessed downward due to the second device isolation layer 26. On the front surface 21F of the substrate 21, a surface of the support region 24 may be substantially coplanar with surfaces of the first light-receiving region 22A and the first light-blocking region 23A which are adjacent to each other.

Referring to FIG. 13, a semiconductor device according to some example embodiments of the inventive concepts may include a support region 24, a first device isolation layer 25, a second device isolation layer 26, a first insulating layer 55, a second insulating layer 57, a third insulating layer 71, a light-blocking pattern 73, a color filter 75, a fourth insulating layer 77, and a microlens 79.

Referring to FIG. 14, a second device isolation layer 26 may be formed between a support region 24 and a first light-receiving region 22A and between the support region 24 and a first light-blocking region 23A. In a front surface 21F of a substrate 21, surfaces of the first light-receiving region 22A, the first light-blocking region 23A, the support region 24, the second device isolation layer 26, and a first device isolation layer 25 may be substantially coplanar. On the front surface 21F of the substrate 21, surfaces of a first ground region 27, a second ground region 28, the support region 24, the second device isolation layer 26, and the first device isolation layer 25 may be substantially coplanar.

Referring to FIG. 15, a semiconductor device according to some example embodiments of the inventive concepts may include a support region 24, a first device isolation layer 25, a first insulating layer 55, a second insulating layer 57, a third insulating layer 71, a light-blocking pattern 73, a color filter 75, a fourth insulating layer 77, and a microlens 79.

Figure 16:
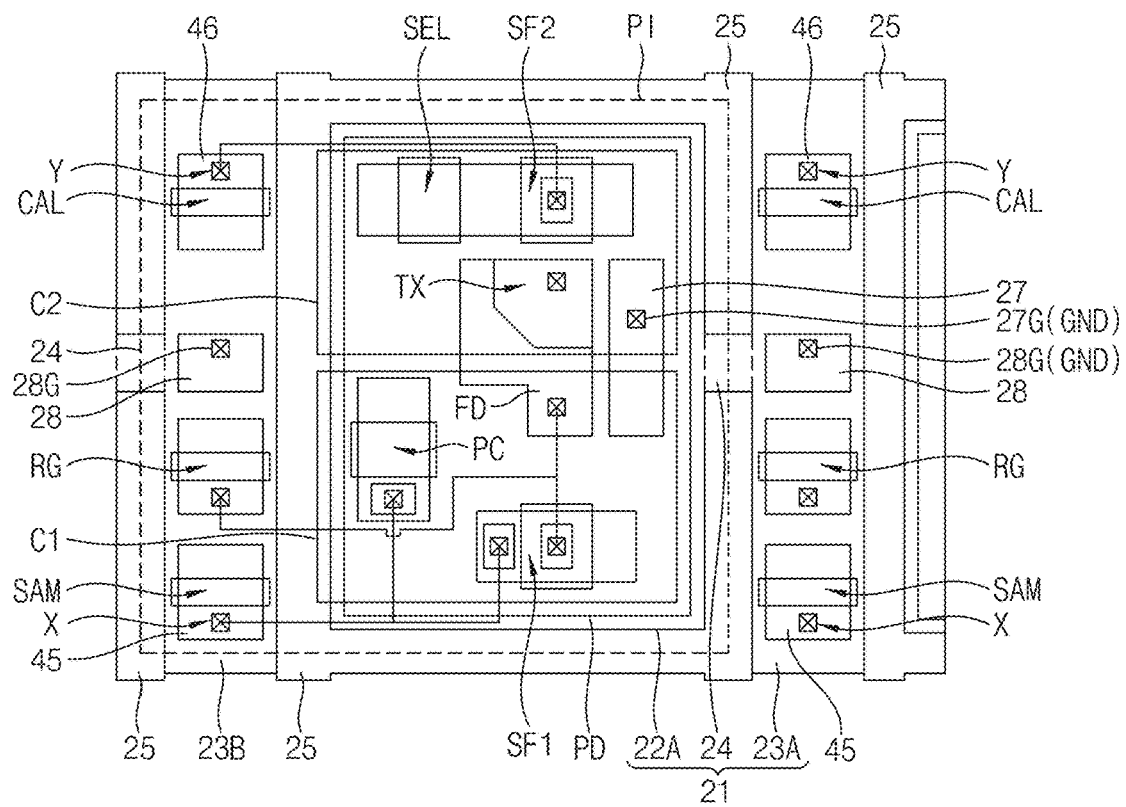
FIGS. 16 and 17 are layouts illustrating a semiconductor device according to some example embodiments of the inventive concepts.
Figure 17:
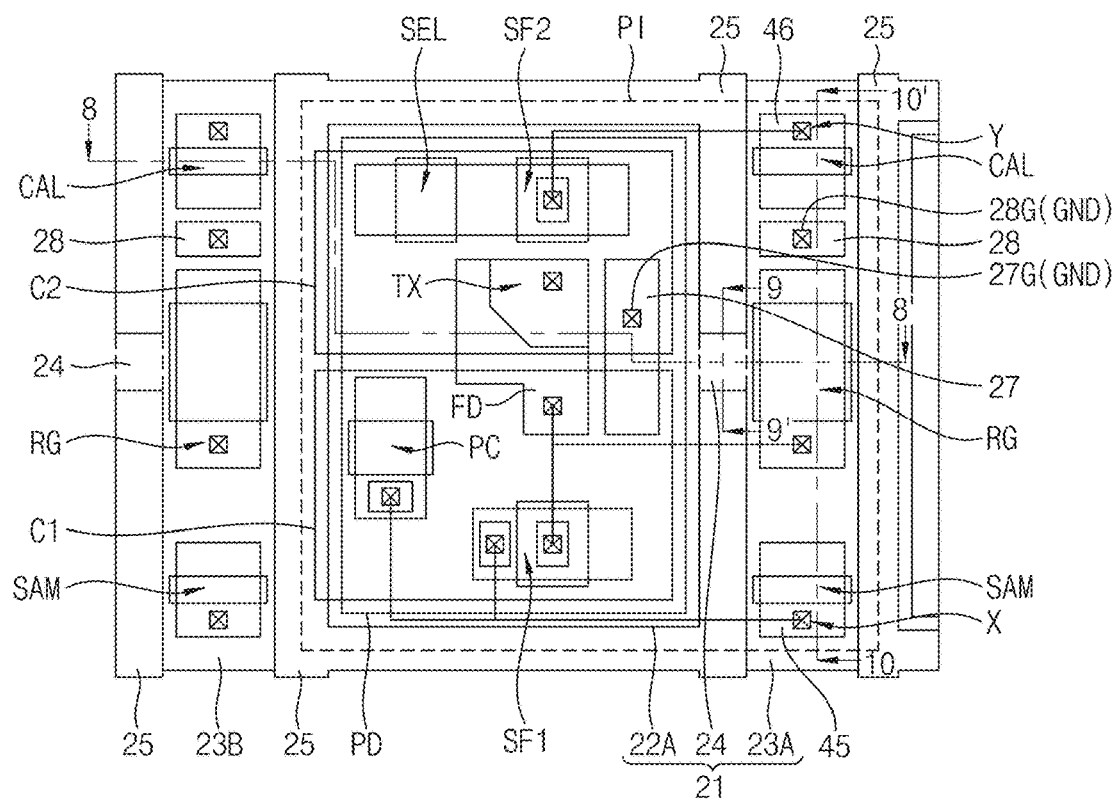
Figure 18:
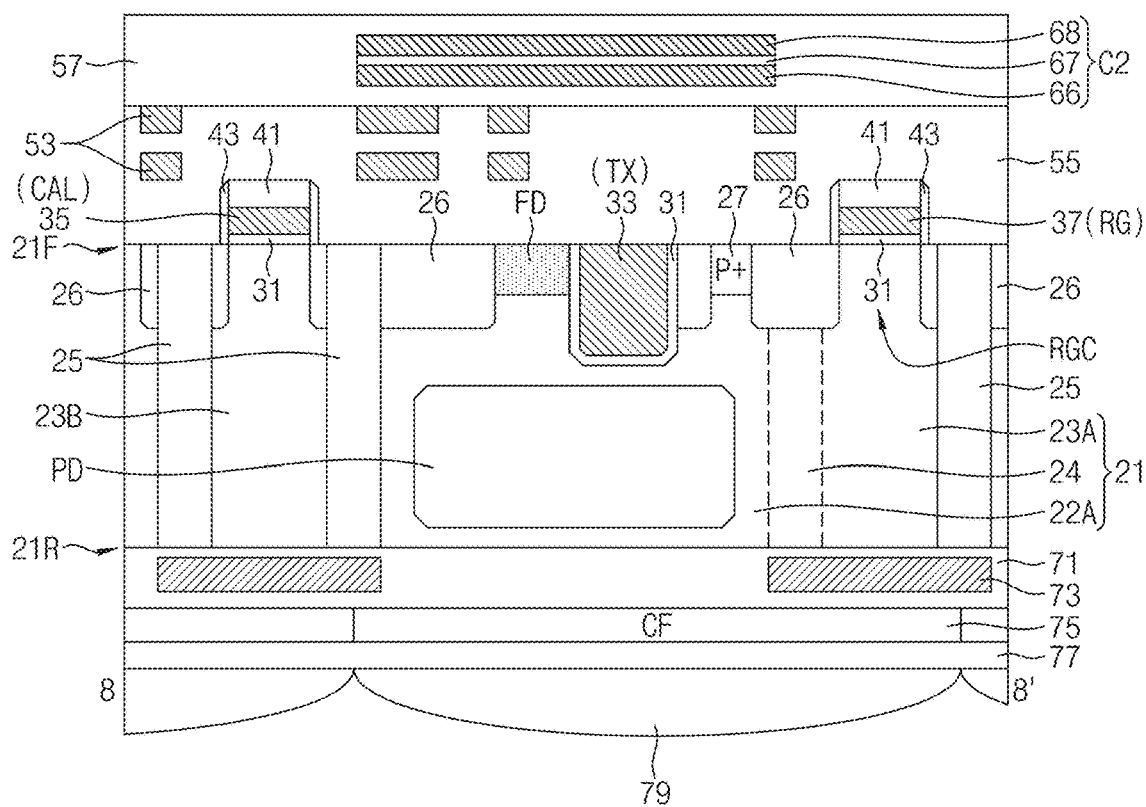
FIGS. 18 and 21 are cross-sectional views taken along line 8-8' of FIG. 17 according to some example embodiments of the inventive concepts.
Figure 19:
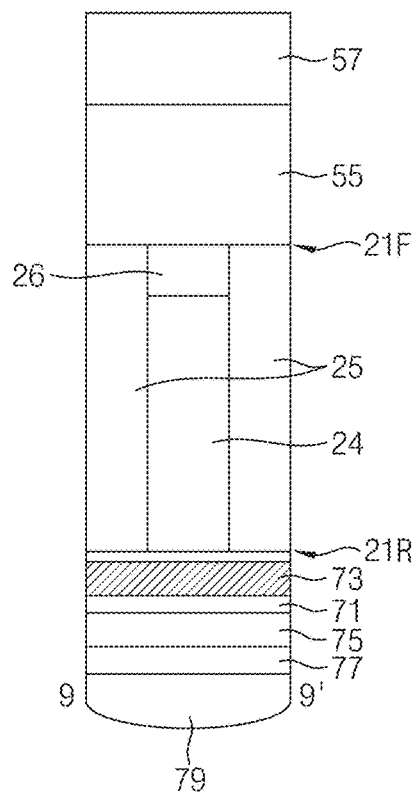
FIGS. 19 and 22 are cross-sectional views taken along line 9-9' of FIG. 17 according to some example embodiments of the inventive concepts.
Figure 20:
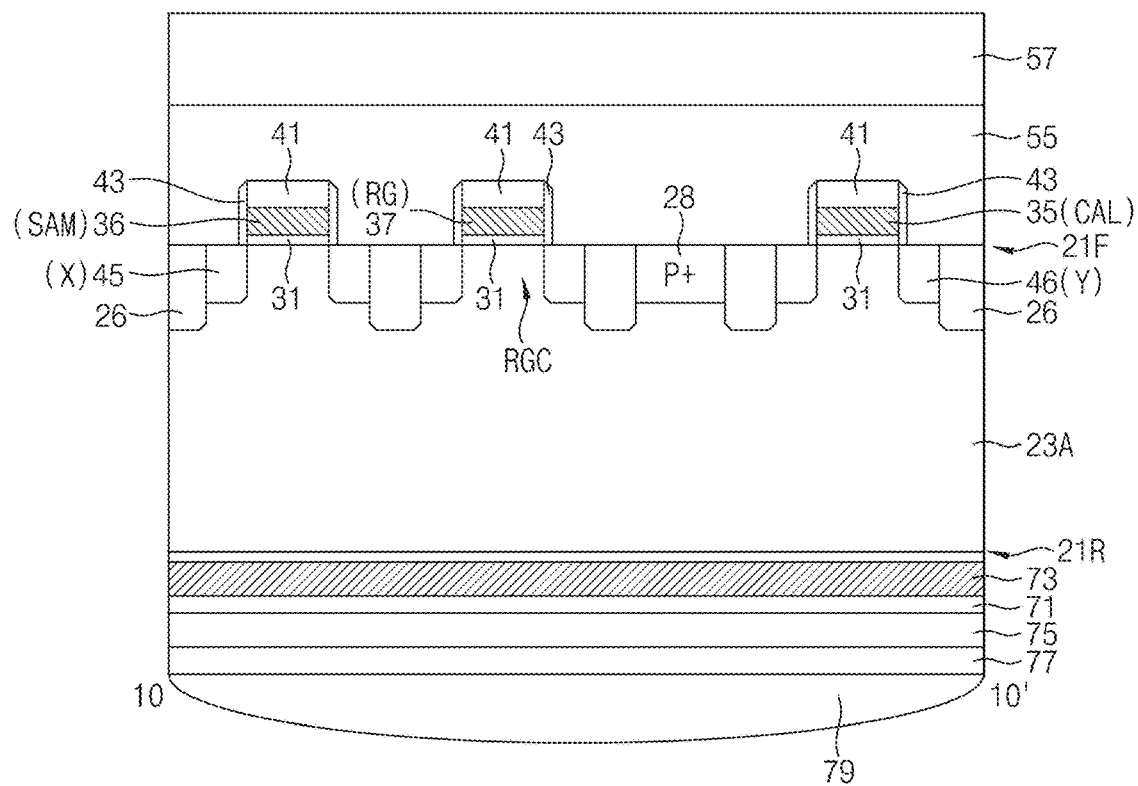
FIG. 20 is a cross-sectional view taken along line 10-10' of FIG. 17 according to some example embodiments of the inventive concepts.
Figure 21:
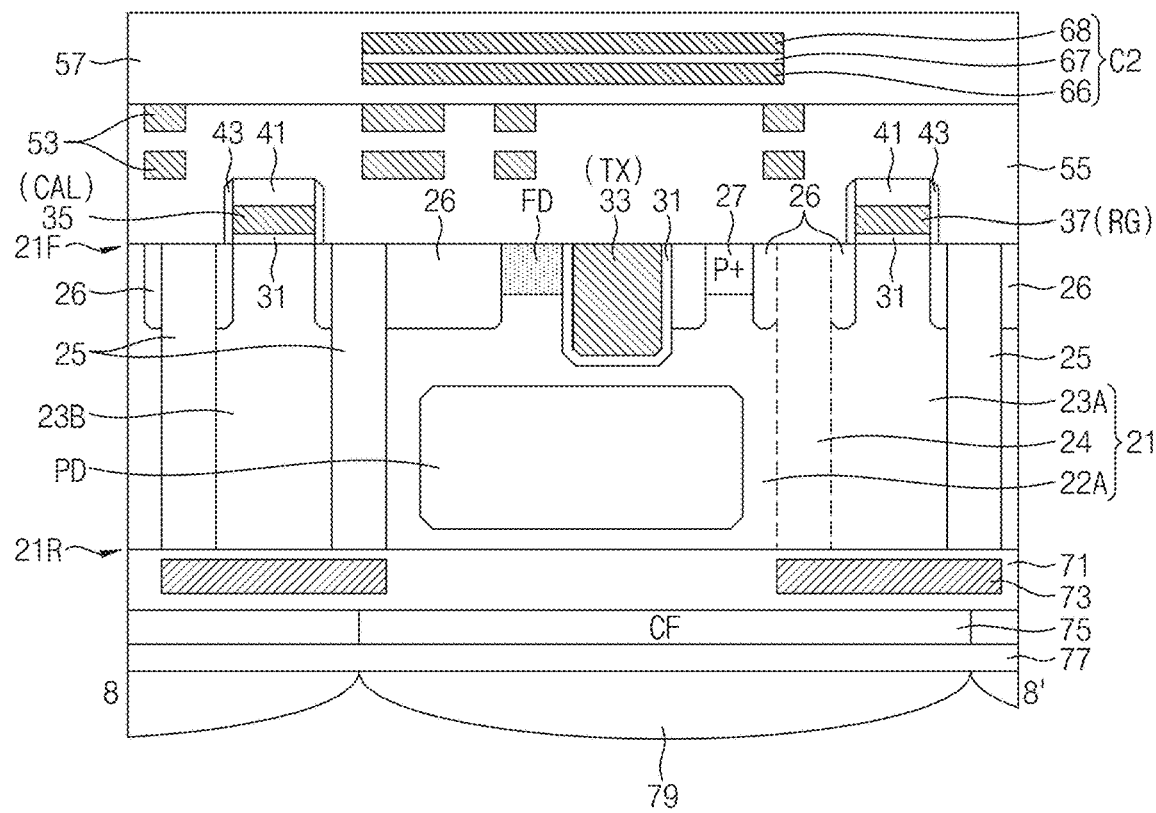
Figure 22:
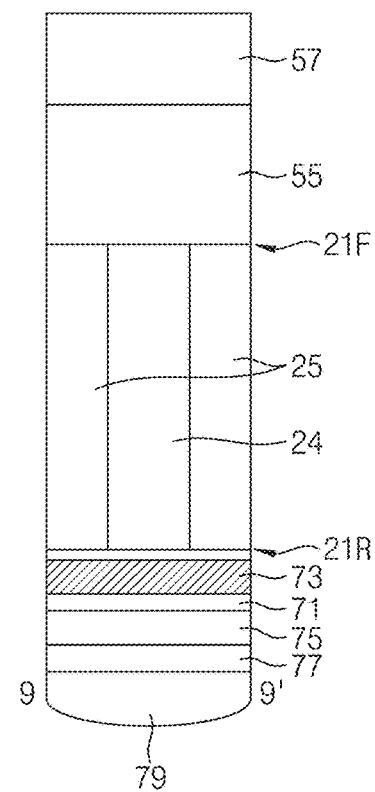

FIGS. 16 and 17 are layouts illustrating a semiconductor device according to some example embodiments of the inventive concepts. FIGS. 18 and 21 are cross-sectional views taken along line 8-8' of FIG. 17 according to some example embodiments of the inventive concepts. FIGS. 19 and 22 are cross-sectional views taken along line 9-9' of FIG. 17 according to some example embodiments of the inventive concepts. FIG. 20 is a cross-sectional view taken along line 10-10' of FIG. 17 according to some example embodiments of the inventive concepts.

Referring to FIG. 16, a pixel region P1 may include a first light-receiving region 22A, a second light-blocking region 23B, and a corresponding one of a plurality of support regions 24.

Referring to FIG. 17, the semiconductor device according to some example embodiments of the inventive concepts may include a pixel region P1 of a rear light-receiving image sensor. The semiconductor device may include a substrate 21, a first device isolation layer 25, a first ground region 27, a second ground region 28, a first ground interconnection 27G, a second ground interconnection 28G, a photoelectric conversion element PD, a transfer transistor TX, a floating diffusion region FD, a reset transistor RG, a first source-follower transistor SF1, a pre-charge transistor PC, a sample transistor SAM, a first capacitor C1, a second capacitor C2, a calibration transistor CAL, a second source-follower transistor SF2, a selection transistor SEL, a first node X, and a second node Y.

The substrate 21 may include a first light-receiving region 22A, a first light-blocking region 23A, a second light-blocking region 23B, and a plurality of support regions 24. The first node X may include a first drain region 45 of the sample transistor SAM. The second node Y may include a second drain region 46 of the calibration transistor CAL.

Referring to FIG. 18, a semiconductor device according to some example embodiments of the inventive concepts may include a substrate 21, a first device isolation layer 25, a second device isolation layer 26, a first ground region 27, a photoelectric conversion element PD, a gate dielectric layer 31, a first gate electrode 33 of a transfer transistor TX, a floating diffusion region FD, a second gate electrode 35 of a calibration transistor CAL, a fourth gate electrode 37 of a reset transistor RG, a channel region RGC of the reset transistor RG, a gate capping layer 41, gate spacers 43, a plurality of interconnections 53, a first insulating layer 55, a second insulating layer 57, a second capacitor C2, a third insulating layer 71, a light-blocking pattern 73, a color filter 75, a fourth insulating layer 77, and a microlens 79. The substrate 21 may include a first light-receiving region 22A, a first light-blocking region 23A, a second light-blocking region 23B, and a support region 24.

Referring to FIG. 19, a semiconductor device according to some example embodiments of the inventive concepts may include a support region 24, a first device isolation layer 25, a second device isolation layer 26, a first insulating layer 55, a second insulating layer 57, a third insulating layer 71, a light-blocking pattern 73, a color filter 75, a fourth insulating layer 77, and a microlens 79.

Referring to FIG. 20, a semiconductor device according to some example embodiments of the inventive concepts may include a first light-blocking region 23A, a second device isolation layer 26, a second ground region 28, a gate dielectric layer 31, a third gate electrode 36 of a sample transistor SAM, a first drain region 45 of the sample transistor SAM, a fourth gate electrode 37 of a reset transistor RG, a second gate electrode 35 of a calibration transistor CAL, a second drain region 46 of the calibration transistor CAL, a gate capping layer 41, gate spacers 43, a first insulating layer 55, a second insulating layer 57, a third insulating layer 71, a light-blocking pattern 73, a color filter 75, a fourth insulating layer 77, and a microlens 79. The first drain region 45 of the sample transistor SAM may comprise a first node X. The second drain region 46 of the calibration transistor CAL may comprise a second node Y.

Referring again to FIGS. 17 to 20, the second device isolation layer 26 may be formed on the support region 24. A top surface of the support region 24 may be formed at a lower level than top surfaces of the first ground region 27 and the channel region RGC. The channel region RGC of the reset transistor RG may be formed in the first light-blocking region 23A. The channel region RGC may be disposed adjacent to the support region 24. The channel region RGC may correspond to a second impurity region. The substrate 21 may include P-type impurities having a first concentration. The channel region RGC may include P-type impurities having a fifth concentration higher than the first concentration. The fifth concentration may be substantially lower than or equal to the third concentration. The fourth gate electrode 37 of the reset transistor RG may be disposed on the channel region RGC.

Referring to FIG. 21, a second device isolation layer 26 may be formed between a support region 24 and a first light-receiving region 22A and between the support region 24 and a first light-blocking region 23A. For example, the second device isolation layer 26 may be formed between the support region 24 and a first ground region 27 and between the support region 24 and a channel region RGC. In a front surface 21F of a substrate 21, surfaces of the first ground region 27, the channel region RGC, the support region 24, and the second device isolation layer 26, and a first device isolation layer 25 may be substantially coplanar.

Referring to FIG. 22, a semiconductor device according to some example embodiments of the inventive concepts may include a support region 24, a first device isolation layer 25, a first insulating layer 55, a second insulating layer 57, a third insulating layer 71, a light-blocking pattern 73, a color filter 75, a fourth insulating layer 77, and a microlens 79. In a front surface 21F of a substrate 21, surfaces of the support region 24 and the first device isolation layer 25 may be substantially coplanar.

FIGS. 23 to 32 are cross-sectional views illustrating a method of forming a semiconductor device according to some example embodiments of the inventive concepts.

FIGS. 23, 25, 27, 29, and 31 are cross-sectional views taken along line 1-1' of FIG. 5 according to some example embodiments of the inventive concepts. FIGS. 24, 26, 28, 30, and 32 are cross-sectional views taken along line 2-2' of FIG. 5 according to some example embodiments of the inventive concepts.

Figure 23:
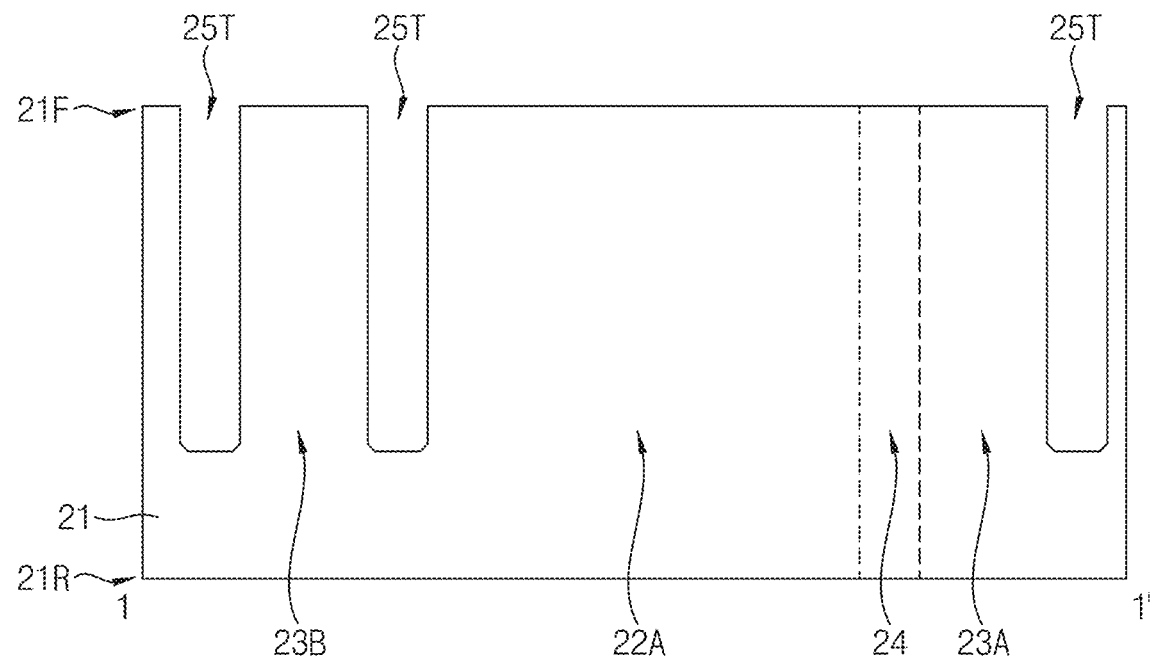
FIGS. 23 to 34 are cross-sectional views illustrating a method of forming a semiconductor device according to some example embodiments of the inventive concepts.
Figure 24:
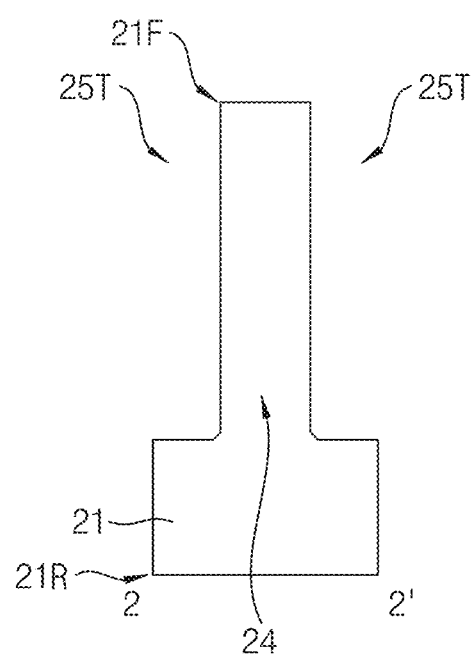

Referring to FIGS. 5, 23, and 24, a plurality of first device isolation trenches 25T may be formed in a substrate 21 to define a first light-receiving region 22A, a first light-blocking region 23A, a second light-blocking region 23B, and a support region 24. Each of the plurality of first device isolation trenches 25T may be formed from a front surface 21F of the substrate 21 toward a rear surface 21R thereof. The formation of the plurality of first device isolation trenches 25T may include a patterning process and a cleaning process. The support region 24 may serve to reduce or substantially prevent the leaning of the first light-blocking region 23A and the second light-blocking region 23B.

The substrate 21 may include a semiconductor substrate such as a single-crystalline silicon wafer. The substrate 21 may include P-type impurities such as boron (B). Each of the first light-blocking region 23A and the second light-blocking region 23B may exhibit a smaller width than the first light-receiving region 22A. The support region 24 may be defined between the first light-receiving region 22A and the first light-blocking region 23A. The support region 24 may be continuous with the first light-receiving region 22A and the first light-blocking region 23A, such that the support region 24 is along the length of the first light-receiving region 22A and the first light-blocking region 23A. On the front surface 21F of the substrate 21, surfaces of the support region 24, the first light-receiving region 22A, the first light-blocking region 23A, and the second light-blocking region 23B may be substantially coplanar.

Figure 25:
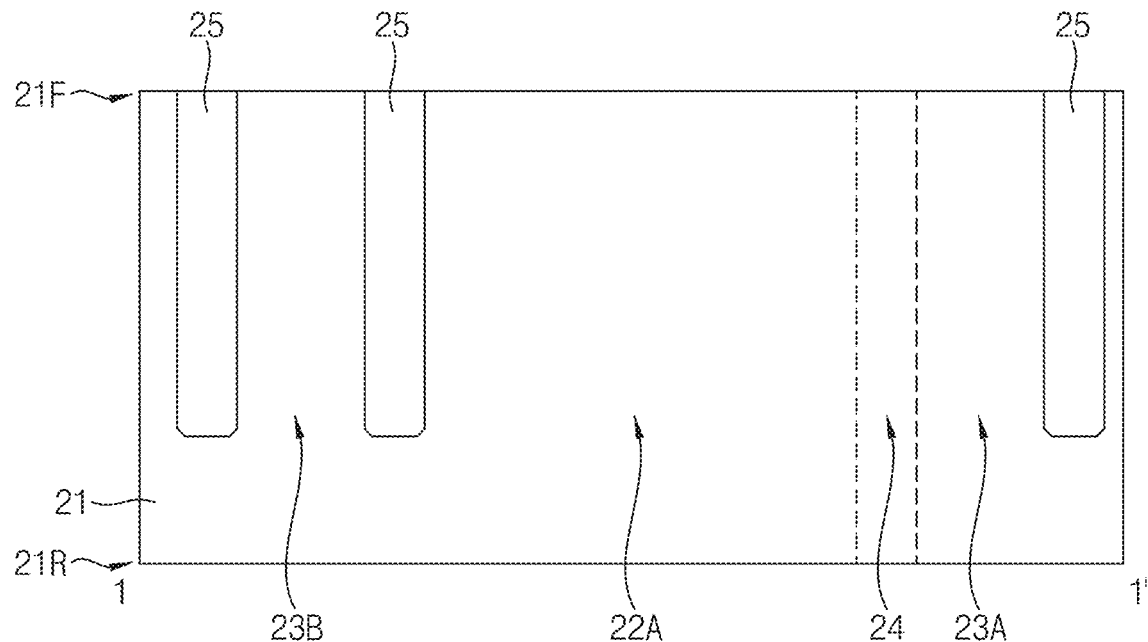
Figure 26:
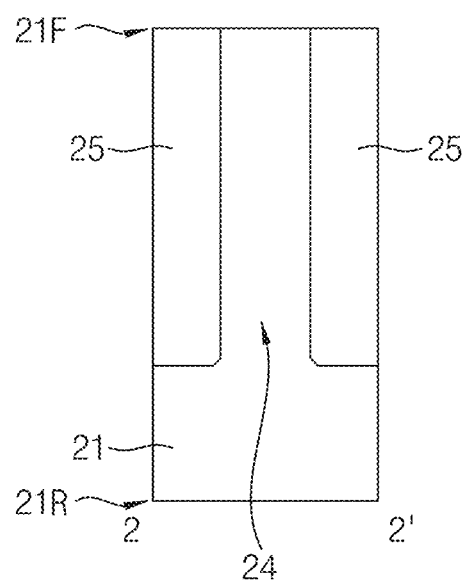

Referring to FIGS. 5, 25, and 26, the first device isolation layer 25 may be formed inside the plurality of first device isolation trenches 25T. The first device isolation layer 25 may include silicon oxide, silicon nitride, silicon oxynitride, low-k dielectrics, high-k dielectrics, or a combination thereof. The first device isolation layer 25 may include an integral insulation structure formed from an entrance of each of the plurality of first device isolation trenches 25T to a bottom thereof. The first device isolation layer 25 may be a single layer or a multilayer. On the front surface 21F of the substrate 21, the surfaces of the first device isolation layer 25, the support region 24, the first light-receiving region 22A, the first light-blocking region 23A, and the second light-blocking region 23B may be substantially coplanar. The first device isolation layer 25 may be formed between the first light-receiving region 22A and the first light-blocking region 23A and between the first light-receiving region 22A and the second light-blocking region 23B. The first device isolation layer 25 may be in direct contact with a side surface of the support region 24.

Figure 27:
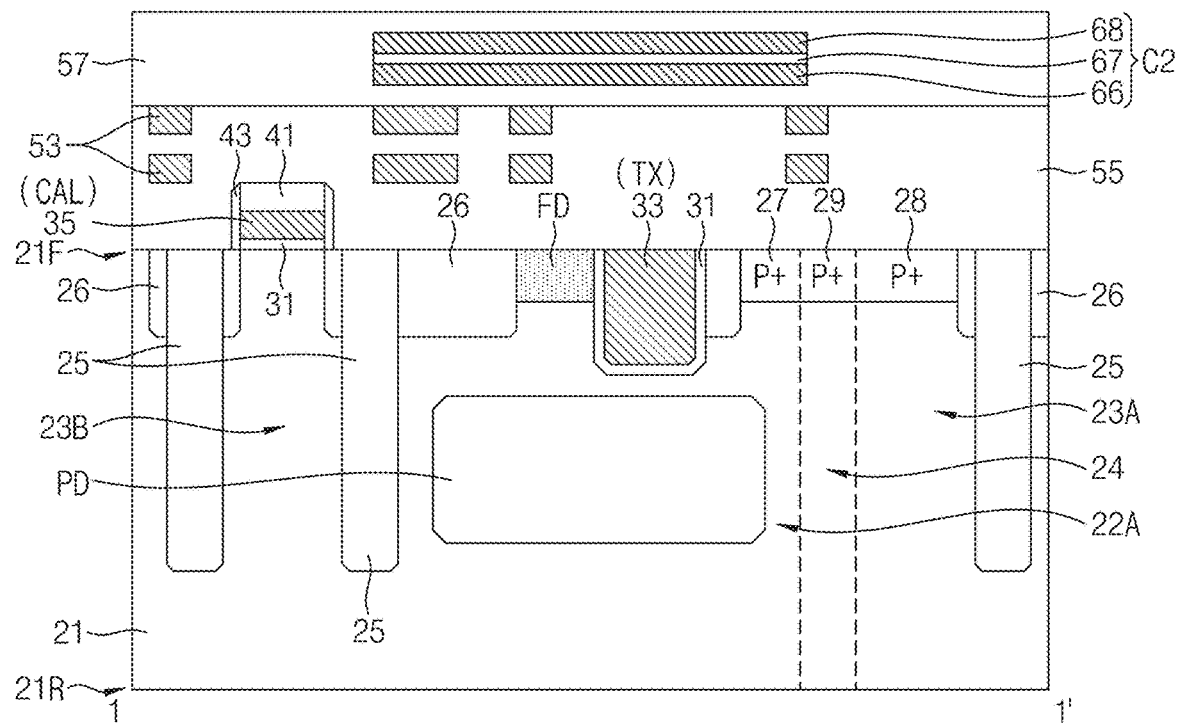
Figure 28:
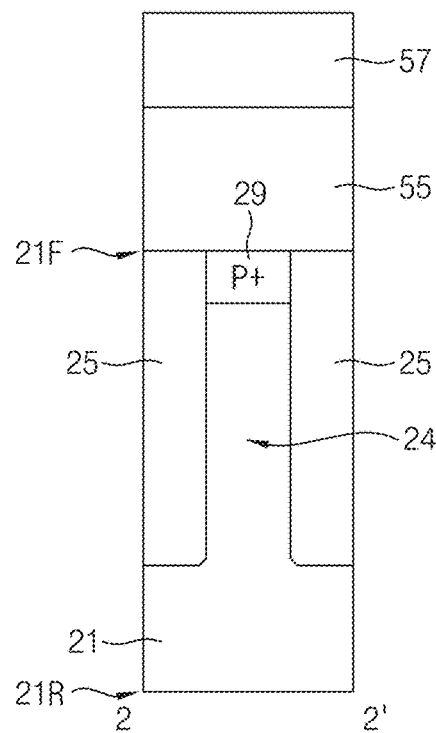

Referring to FIGS. 5, 27, and 28, the photoelectric conversion element PD may be formed in the first light-receiving region 22A. The photoelectric conversion element PD may include N-type impurities such as phosphorus (P), arsenic (As), or a combination thereof. A second device isolation layer 26, a first ground region 27, a second ground region 28, a third ground region 29, a gate dielectric layer 31, a first gate electrode 33 of a transfer transistor TX, and a floating diffusion region FD may be formed in the substrate 21. The second device isolation layer 26, the first ground region 27, the second ground region 28, the third ground region 29, the gate dielectric layer 31, the first gate electrode 33 of the transfer transistor TX, and the floating diffusion region FD may be formed adjacent to the front surface 21F of the substrate 21.

The first ground region 27, the first gate electrode 33 of the transfer transistor TX, and the floating diffusion region FD may be formed in the first light-receiving region 22A. The second ground region 28 may be formed in the first light-blocking region 23A. The third ground region 29 may be formed in the support region 24.

The third ground region 29 may be continuous with the first ground region 27 and the second ground region 28, such that the third ground region 29 is along the length of the first ground region 27 and the second ground region 28. The substrate 21 may include P-type impurities having a first concentration. The first ground region 27, the second ground region 28, and the third ground region 29 may include P-type impurities having a second concentration higher than the first concentration. A concentration of the P-type impurities may be substantially the same in the first ground region 27, the second ground region 28, and the third ground region 29.

The floating diffusion region FD may include N-type impurities. The first ground region 27 may be disposed between the floating diffusion region FD and the second ground region 28. A lower end of the first gate electrode 33 may be formed at a lower level than top surfaces of the floating diffusion region FD and the first ground region 27. The gate dielectric layer 31 may be interposed between the first gate electrode 33 and the first light-receiving region 22A.

A second gate electrode 35 of a calibration transistor CAL may be formed on the front surface 21F of the substrate 21. The gate dielectric layer 31 may be interposed between the second gate electrode 35 and the substrate 21. A gate capping layer 41 may be formed on the second gate electrode 35. Gate spacers 43 may be formed on side surfaces of the second gate electrode 35 and the gate capping layer 41. A first insulating layer 55 may be formed on the front surface 21F of the substrate 21. A plurality of interconnections 53 may be formed in the first insulating layer 55. A second insulating layer 57 may be formed on the first insulating layer 55. A second capacitor C2 may be formed in the second insulating layer 57. The second capacitor C2 may include a third electrode 66, a fourth electrode 68 opposite to the third electrode 66, a second capacitor dielectric layer 67 interposed between the third electrode 66 and the fourth electrode 68.

Each of the gate dielectric layer 31 and the second capacitor dielectric layer 67 may include silicon oxide, silicon nitride, silicon oxynitride, high-k dielectrics, or a combination thereof. Each of the second device isolation layer 26, the gate capping layer 41, the gate spacer 43, the first insulating layer 55, and the second insulating layer 57 may include silicon oxide, silicon nitride, silicon oxynitride, low-k dielectrics, high-k dielectrics, or a combination thereof. Each of the first gate electrode 33, the second gate electrode 35, the plurality of interconnections 53, the third electrode 66, and the fourth electrode 68 may include a metal, a metal silicide, a metal nitride, a metal oxide, polysilicon, a conductive carbon, or a combination thereof.

Figure 29:
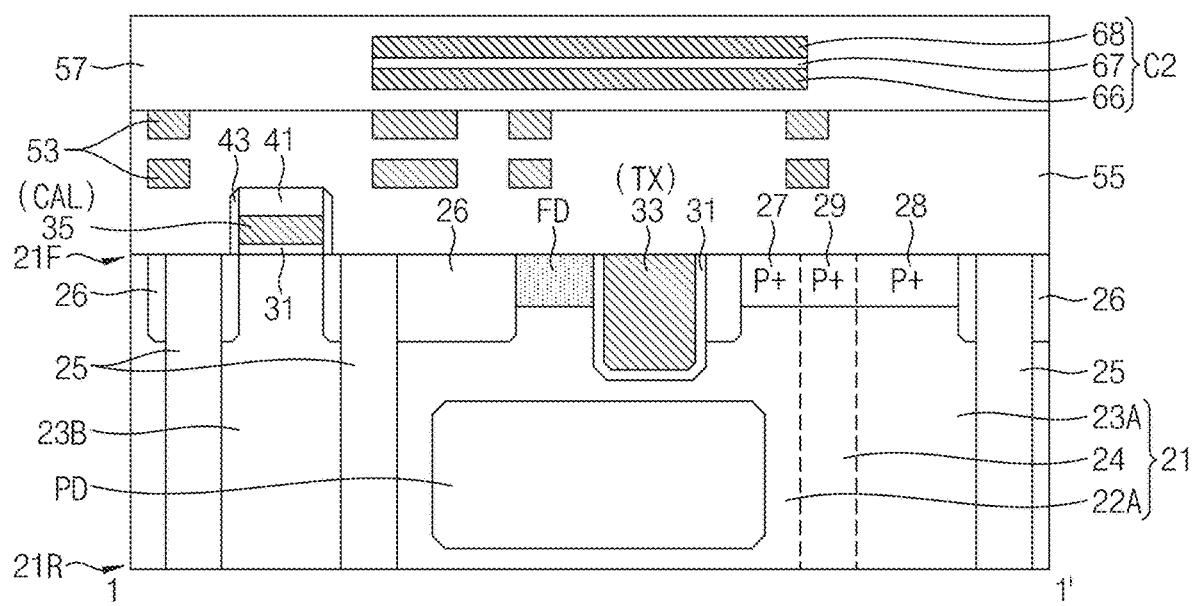
Figure 30:
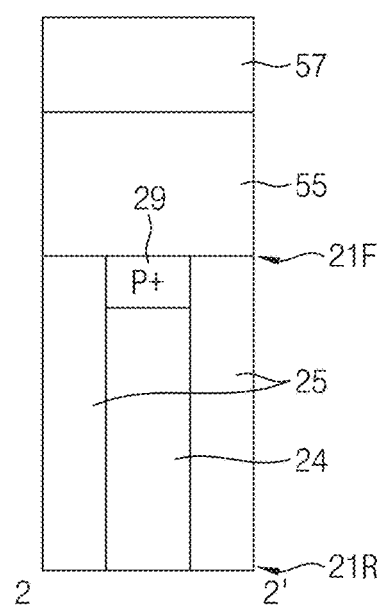

Referring to FIGS. 5, 29, and 30, the rear surface 21R of the substrate 21 may be partially removed to expose the first device isolation layer 25. The first device isolation layer 25 may be formed to pass completely through ("extend") the substrate 21 from the front surface 21F of the substrate 21 to the rear surface 21R thereof. The support region 24, the first light-receiving region 22A, the first light-blocking region 23A, and the second light-blocking region 23B may be defined by the first device isolation layer 25. On the rear surface 21R of the substrate 21, surfaces of the first device isolation layer 25, the support region 24, the first light-receiving region 22A, the first light-blocking region 23A, and the second light-blocking region 23B may be substantially coplanar.

Figure 31:
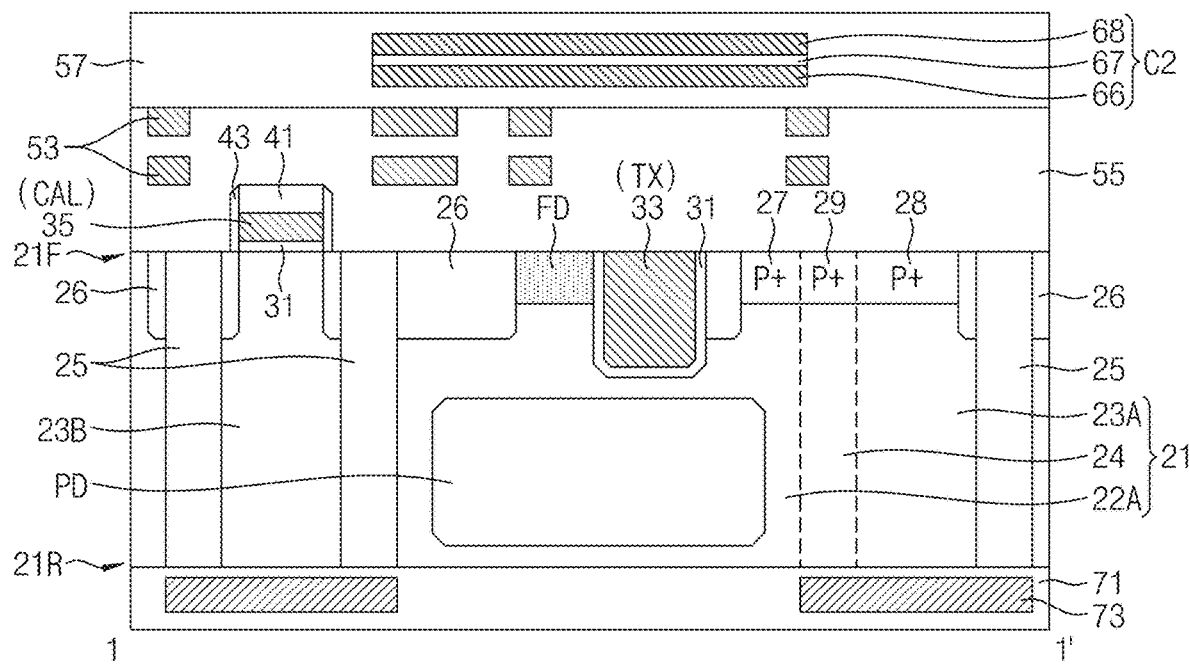
Figure 32:
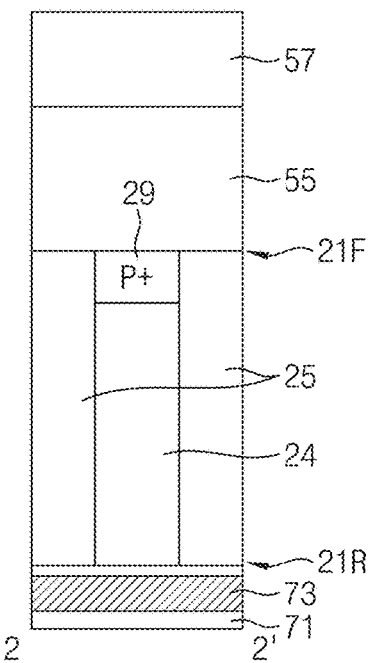

Referring to FIGS. 5, 31, and 32, a third insulating layer 71 may be formed on the rear surface 21R of the substrate 21. A light-blocking pattern 73 may be formed in the third insulating layer 71. The light-blocking pattern 73 may completely cover the first light-blocking region 23A and the second light-blocking region 23B.

Referring again to FIGS. 5, 6, and 7, a color filter 75 may be formed on the third insulating layer 71. A fourth insulating layer 77 may be formed on the color filter 75. A microlens 79 may be formed on the fourth insulating layer 77.

Figure 33:
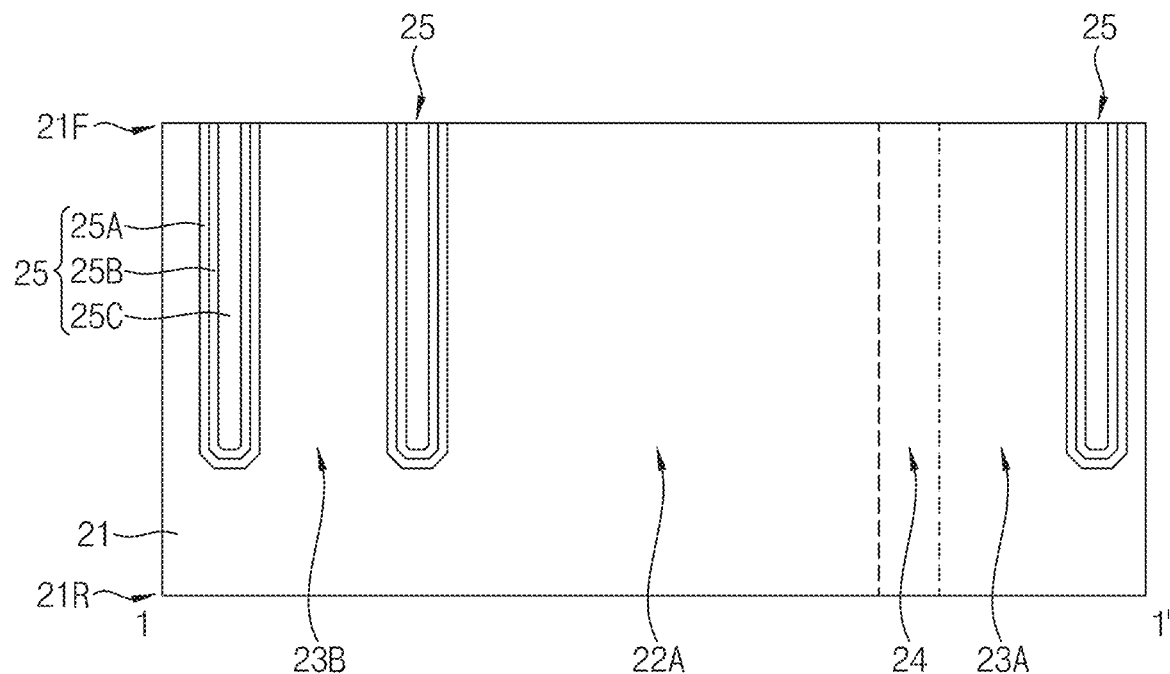
Figure 34:
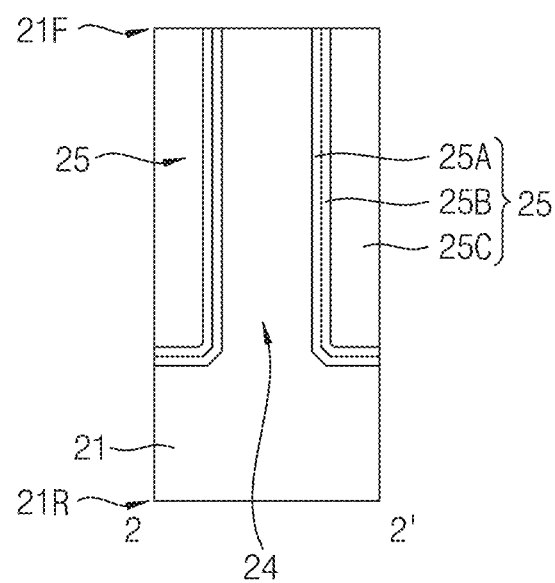

FIGS. 33 and 34 are cross-sectional views illustrating a method of forming a semiconductor device according to some example embodiments of the inventive concepts. FIG. 33 is a cross-sectional view taken along line 1-1' of FIG. 5 according to some example embodiments of the inventive concepts. FIG. 34 is a cross-sectional view taken along line 2-2' of FIG. 5 according to some example embodiments of the inventive concepts.

Referring to FIGS. 5, 33, and 34, the first device isolation layer 25 may include a first layer 25A, a second layer 25B disposed on the first layer 25A, and a third layer 25C disposed on the second layer 25B. In an example embodiment, the first layer 25A may include silicon oxide, the second layer 25B may include silicon nitride, and the third layer 25C may include silicon oxide, silicon nitride, silicon oxynitride, low-k dielectrics, or a combination thereof. The second layer 25B may surround the outside of the third layer 25C, and the first layer 25A may surround the outside of the second layer 25B.

According to some example embodiments of the inventive concepts, a support region can be provided between a light-receiving region and a light-blocking region. The support region can serve to reduce or substantially prevent process defects (e.g., leaning) in the light-blocking region. The light-receiving region and the light-blocking region can include a plurality of ground regions. The support region can be disposed adjacent to the plurality of ground regions. An image sensor having high mass production efficiency and excellent electrical properties can be implemented.

While some example embodiments of the inventive concepts have been described with reference to the accompanying drawings, it should be understood by those skilled in the art that various modifications may be made without departing from the scope of the inventive concepts and without changing essential features thereof. Therefore, the above-described example embodiments should be considered in a descriptive sense only and not for purposes of limitation.

What is claimed is:

1. A semiconductor device comprising:
a substrate having a first surface and a second surface opposite to the first surface;
a device isolation layer which defines a first region, a second region, and a support region in the substrate, wherein the second region has a smaller width than the first region, and the support region is between the first region and the second region; and
a photoelectric conversion element in the first region, wherein the support region is continuous with the first region and the second region, and
the device isolation layer has an integral insulation structure which extends through the substrate from the first surface of the substrate to the second surface of the substrate.

2. The semiconductor device of claim 1, wherein:
the device isolation layer is between the first region and the second region; and
the device isolation layer is in contact with a side surface of the support region.

3. The semiconductor device of claim 1, wherein, on the second surface of the substrate, surfaces of the first region, the support region, and the second region are substantially coplanar.

4. The semiconductor device of claim 1, wherein, on the second surface of the substrate, surfaces of the device isolation layer, the first region, the support region, and the second region are substantially coplanar.

5. The semiconductor device of claim 1, wherein, on the first surface of the substrate, a surface of the support region is substantially coplanar with surfaces of the first region and the second region which are adjacent to each other.

6. The semiconductor device of claim 1, further comprising a first impurity region disposed in the first region and adjacent to the support region,
wherein the substrate includes P-type impurities having a first concentration, and
the first impurity region includes P-type impurities having a second concentration, which is higher than the first concentration.

7. The semiconductor device of claim 6, wherein the first impurity region is adjacent to the first surface of the substrate, and
the first impurity region is connected to a first ground interconnection.

8. The semiconductor device of claim 6, further comprising a floating diffusion region in the first region,
wherein the floating diffusion region is adjacent to the first surface and includes N-type impurities,
the first impurity region is between the floating diffusion region and the support region, and
the photoelectric conversion element is adjacent to the second surface.

9. The semiconductor device of claim 1, further comprising a second impurity region in the second region and disposed adjacent to the support region,
wherein the second impurity region includes P-type impurities.

10. The semiconductor device of claim 9, wherein the substrate includes P-type impurities having a first concentration, and
the second impurity region includes P-type impurities having a third concentration which is higher than the first concentration.

11. The semiconductor device of claim 9, wherein the second impurity region is adjacent to the first surface.

12. The semiconductor device of claim 9, further comprising at least one drain region in the second region and adjacent to the first surface,
wherein the at least one drain region includes N-type impurities, and
a distance between the second impurity region and the support region is smaller than a distance between the at least one drain region and the support region.

13. The semiconductor device of claim 9, wherein the second impurity region is connected to a second ground interconnection.

14. The semiconductor device of claim 9, further comprising a gate electrode on the second impurity region.

15. The semiconductor device of claim 1, further comprising a third impurity region in the support region and adjacent to the first surface,
wherein the substrate includes P-type impurities having a first concentration, and
the third impurity region includes P-type impurities having a fourth concentration which is higher than the first concentration.

16. The semiconductor device of claim 15, further comprising a first impurity region in the first region and adjacent to the support region,
wherein the first impurity region includes P-type impurities having a second concentration which is higher than the first concentration, and
the fourth concentration is substantially equal to the second concentration.

17. The semiconductor device of claim 1, further comprising a light-blocking pattern on the second surface of the substrate,
wherein the light-blocking pattern completely covers the second region.

18. The semiconductor device of claim 17, further comprising:
a color filter on the second surface of the substrate; and
a microlens disposed on the color filter,
wherein the light-blocking pattern is between the second surface and the microlens.

19. A semiconductor device comprising:
a substrate having a first surface and a second surface opposite to the first surface;
a device isolation layer which extends through the substrate from the first surface of the substrate to the second surface of the substrate, the device isolation layer defining a plurality of light-receiving regions, a plurality of light-blocking regions, and a plurality of support regions in the substrate, wherein each of the plurality of support regions are respectively between each one of the plurality of light-receiving regions and one of the plurality of light-blocking regions; and
a plurality of photoelectric conversion elements in the plurality of light-receiving regions,
wherein each of the plurality of light-blocking regions has a smaller width than each of the plurality of light-receiving regions,
the device isolation layer has an integral insulation structure,
the plurality of light-blocking regions include a first light-blocking region and a second light-blocking region isolated from direct contact with each other,
the plurality of light-receiving regions include a first light-receiving region and a second light-receiving region isolated from direct contact with each other, between the first light-blocking region and the second light-blocking region,
a corresponding one of the plurality of support regions is continuous with the first light-receiving region and the second light-blocking region, and
another corresponding one of the plurality of support regions is continuous with the second light-receiving region and the first light-blocking region.

20. A semiconductor device comprising:
a substrate having a first surface and a second surface opposite to the first surface;
a device isolation layer defining a light-receiving region, a light-blocking region, and a support region in the substrate, wherein the light-blocking region has a smaller width than the light-receiving region, and the support region is between the light-receiving region and the light-blocking region;
a photoelectric conversion element in the light-receiving region and adjacent to the second surface;
a floating diffusion region in the light-receiving region and adjacent to the first surface;
a transfer transistor, a first source-follower transistor, a pre-charge transistor, a second source-follower transistor, a selection transistor, and a first ground region which are on the light-receiving region and adjacent to the first surface;
a first capacitor and a second capacitor on the first surface of the substrate; and
a reset transistor, a sample transistor, a calibration transistor, and a second ground region which are on the light-blocking region and adjacent to the first surface,
wherein the support region is adjacent to the first ground region,
the support region is continuous with the light-receiving region and the light-blocking region, and
the device isolation layer has an internal insulation structure which extends through the substrate from the first surface of the substrate to the second surface of the substrate.

* * * * *